United States Patent
Inoue et al.

(10) Patent No.: US 6,552,632 B2
(45) Date of Patent: Apr. 22, 2003

(54) SURFACE ACOUSTIC WAVE RESONATOR WITH WITHDRAWN ELECTRODES AND SURFACE ACOUSTIC WAVE LADDER FILTER USING SAME

(75) Inventors: Shogo Inoue, Kawasaki (JP); Jun Tsutsumi, Kawasaki (JP); Takashi Matsuda, Kawasaki (JP); Osamu Ikata, Kawasaki (JP)

(73) Assignees: Fujitsu Limited, Kawasaki (JP); Fujitsu Media Devices Limited, Suzaka (JP)

( * ) Notice: Subject to any disclaimer, the term of this patent is extended or adjusted under 35 U.S.C. 154(b) by 0 days.

(21) Appl. No.: 09/940,888

(22) Filed: Aug. 29, 2001

(65) Prior Publication Data

US 2002/0153969 A1 Oct. 24, 2002

(30) Foreign Application Priority Data

Apr. 20, 2001 (JP) ........................................ 2001-122754

(51) Int. Cl.[7] .............................. H03H 9/64; H03H 9/25; H03H 9/145
(52) U.S. Cl. .................... 333/195; 333/196; 310/313 C; 310/313 D
(58) Field of Search ................................ 333/193–196; 310/313 R, 313 B, 313 C, 313 D

(56) References Cited

U.S. PATENT DOCUMENTS

| | | | | |
|---|---|---|---|---|
| 5,528,206 A | * | 6/1996 | Watanabe | ............... 333/196 X |
| 5,844,453 A | * | 12/1998 | Matsui et al. | ............... 333/193 |
| 5,986,524 A | * | 11/1999 | Shimoe | ...................... 333/195 |
| 6,051,908 A | * | 4/2000 | Garber et al. | ........... 333/193 X |
| 6,246,302 B1 | * | 6/2001 | Müller et al. | ........... 333/196 X |

FOREIGN PATENT DOCUMENTS

| | | | | |
|---|---|---|---|---|
| JP | 4-207618 | * | 7/1992 | |
| JP | 4-266209 | * | 9/1992 | ............. 310/313 B |
| JP | 8-23256 | | 1/1996 | |
| JP | 11-163644 | | 6/1999 | |
| JP | 2001-500697 | | 1/2001 | |

OTHER PUBLICATIONS

Y. Satoh et al.; "Resonator–Type Low–Loss Filters"; *Proc. Int'l Symp. SAW Devices for Mobile Comm.*, pp. 179–185, 1992.

Professor Ken–ya Hashimoto, "Surface Acoustic Wave Devices in Telecommunications" *Coupling–of–Modes Theory*, Published by Springer–Verlag, Berlin (Pub. Date:2000), pp. 200–201 and 216–217.

* cited by examiner

*Primary Examiner*—Barbara Summons
(74) *Attorney, Agent, or Firm*—Armstrong, Westerman & Hattori, LLP

(57) ABSTRACT

A surface acoustic wave resonator including at least one interdigital transducer formed on a piezoelectric substrate, wherein the at least one interdigital transducer includes a predetermined number of interdigitated electrode fingers, at least two electrode fingers among the interdigitated electrode fingers are withdrawn, and the positions of the withdrawal electrode fingers are aperiodic.

10 Claims, 21 Drawing Sheets

FIG. 3 (a) (Prior Art)
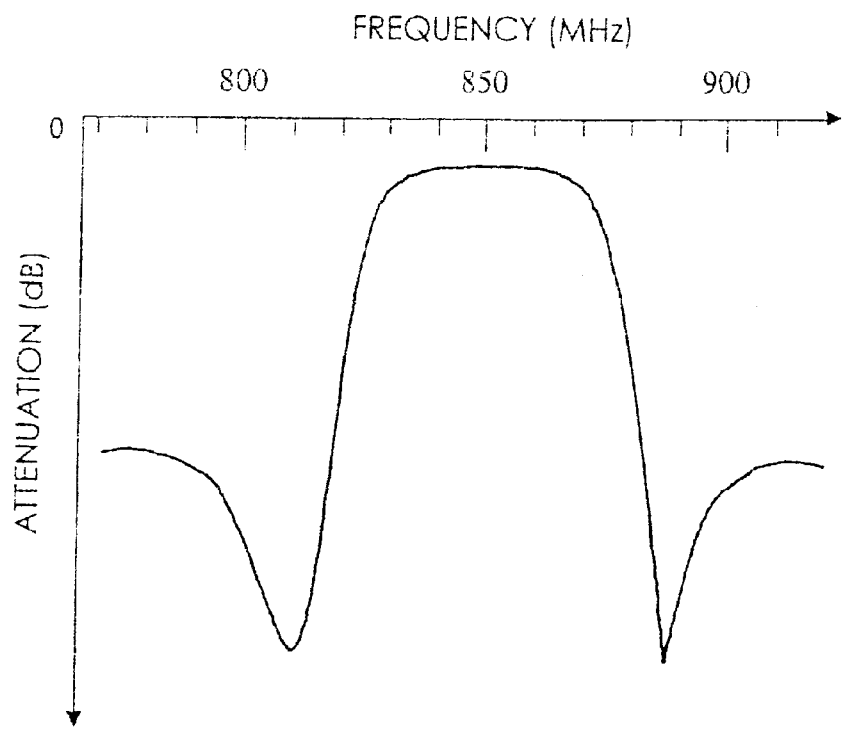
FIG. 3 (b) (Prior Art)
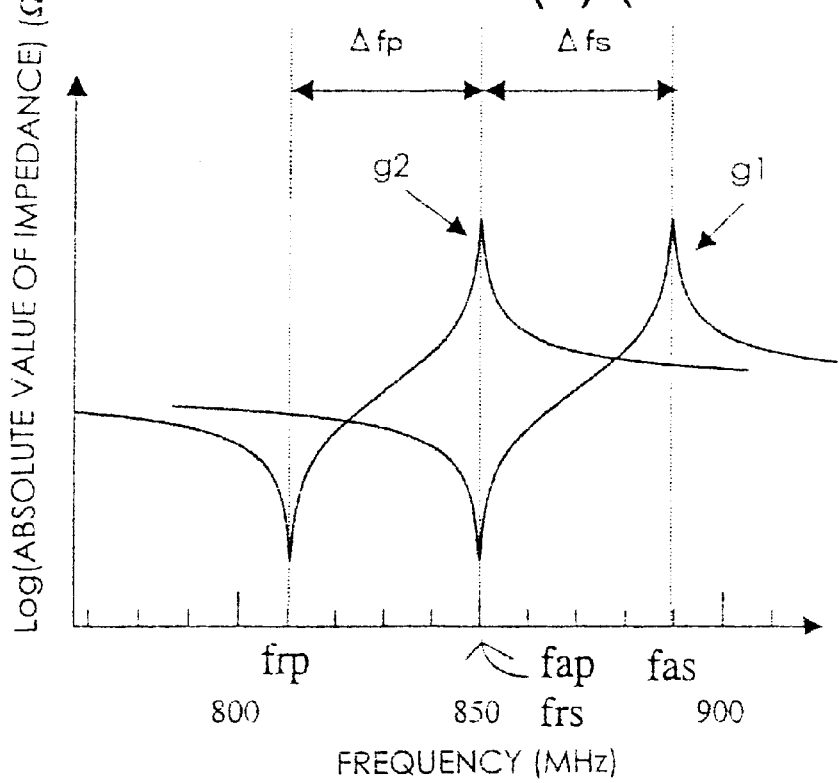

SURFACE ACOUSTIC WAVE RESONATOR WITH WITHDRAWN ELECTRODES AND SURFACE ACOUSTIC WAVE LADDER FILTER USING SAME

CROSS-REFERENCE TO RELATED APPLICATION

This application is related to Japanese Patent Application No. 2001-122754 filed in Apr. 20, 2001, whose priority is claimed under 35 USC §119, the disclosure of which is incorporated by reference in its entirety.

BACKGROUND OF THE INVENTION

1. Field of the Invention

The present invention relates to a surface acoustic wave resonator, and more particularly, it relates to a ladder type surface acoustic wave filter having plural surface acoustic wave resonators arranged in a series-arm and a parallel-arm.

2. Description of the Related Art

A ladder type surface acoustic wave (hereinafter referred to as SAW) filter using plural SAW resonators has been known as a band pass filter (see, for example, Journal of Institute of Electronics, Information and Communication Engineers A, Vol. J 76-A, No. 2, pp. 245–252 (1993)).

FIG. 1 shows a constitutional diagram of a conventional ladder type SAW filter.

A ladder type SAW filter has such a constitution that series-arm SAW resonators $S_1$ and $S_2$ are arranged between an input terminal Ti and an output terminal To of a piezoelectric substrate, and parallel-arm SAW resonators $P_1$ and $P_2$ are arranged between the input and output terminals and a ground terminal G. SAW resonators $S_1$, $S_2$, $P_1$, $P_2$, are generally called a one-port SAW resonators.

FIG. 2 shows a constitutional diagram of a one-port SAW resonator. A one-port SAW resonator has such a constitution that an interdigital transducer (hereinafter referred to as IDT) for electrically exciting SAW and reflectors arranged on a propagation path of the SAW for trapping the excited SAW in the IDT are formed on the piezoelectric substrate. In the case where resonant properties are obtained by utilizing internal reflection of the SAW by the IDT itself, the reflectors are not arranged on the substrate.

The IDT is formed with a large number of electrode fingers arranged in a comb form with a constant period (pi).

The reflectors are formed with a large number of grating electrode fingers arranged with a constant period (pr) and is also referred to as a grating reflector.

In the IDT, the SAW is excited by two adjacent electrode fingers each extending downward and upward as one unit.

A ladder type SAW filter is designed in such a manner that a resonance frequency frs of the series-arm SAW resonators $S_1$ and $S_2$ substantially agrees to an antiresonance frequency fap of the parallel-arm SAW resonators $P_1$ and $P_2$.

FIG. 3(a) is a graph showing a pass characteristic diagram of a ladder type SAW filter, and FIG. 3(b) is a graph showing single impedance characteristic diagrams at this time of the series-arm SAW resonators $S_1$ an $S_2$ and the parallel-arm SAW resonators $P_1$ and $P_2$. The graph $g_1$ in FIG. 3(b) is a graph of the series-arm SAW resonators $S_1$ and $S_2$, and the graph $g_2$ is a graph of the parallel-arm SAW resonators $P_1$ and $P_2$. In the graph $g_1$ of the series-arm SAW resonators, the frequency where the impedance becomes minimum is the resonance frequency frs, and the frequency where the impedance becomes maximum is the antiresonance frequency fas.

FIG. 4 is an explanatory diagram of frequency characteristics demanded for a band pass filter, such as a ladder type SAW filter.

The characteristic values herein include demanded pass band widths (BW1 and BW2), attenuation levels (ATT1 and ATT2) defined by the specification, and attenuation band widths (BWatt1 and BWatt2).

A ratio (BW1/BW2) of the band widths BW2 and BW1 at a certain attenuation level is referred to as a shape factor. The closer the shape factor to 1, it is better and referred to as a high shape factor. The shape factor of the ladder type SAW filter is substantially defined by the frequency difference between the resonance frequency fr and the antiresonance frequency fa.

That is, the steepness of the inclination from the attenuation region on the low frequency side to the pass region depends on the frequency difference (Δfp in FIG. 3(b)) between the resonance frequency frp and the antiresonance frequency fap of the parallel-arm resonators $P_1$ and $P_2$, and the smaller the Δfp is, the steeper the inclination is. The steepness of the declination from the pass region to the attenuation region on the high frequency side depends on the frequency difference (Δfs in FIG. 3(b)) between the resonance frequency frs and the antiresonance frequency fas of the series-arm resonators $S_1$ and $S_2$, and the smaller the Δfs is, the steeper the declination is.

However the Δfp and Δfs are almost determined by the electromechanical coupling factor of a piezoelectric substrate used and do not change if the number of electrode pairs or an overlap width of electrodes of the IDT is changed. In this respect, Japanese Unexamined Patent Publication No. HEI 8(1996)-23256 and Japanese Patent Application No. HEI 10(1998)-514149 disclose SAW resonators whose Δfp and Δfs are decreased by withdrawing more electrodes from end portions of the IDT than from a central part.

Japanese Unexamined Patent Publication No. Hei 11(1999)-163664 discloses an SAW filter having Δfp and Δfs that are made small by periodically withdrawing the electrode fingers of the IDT. The Δfp and the Δfs can be adjusted with a simple constitution by using the withdrawing methods, so as to realize a ladder type SAW filter having a desired pass band width and steepness of the edge parts of the pass region.

However, in the case where the electrode fingers of the IDT are periodically withdrawn, the Δfp (Δfs) is decreased to realize a filter of a high shape factor, but such a problem arises that spurious occurs outside the pass band of the filter. The spurious outside the pass band occurs at plural positions corresponding to the period, at which the electrode fingers of the IDT are withdrawn, and there are many cases where the attenuation characteristics demanded outside the pass band of the filter cannot be satisfied.

In the case where the electrode fingers of the IDT are withdrawn in a larger number in the outside of the IDT, on the other hand, spurious occurring outside the pass band can be suppressed, and the Dfp (Dfs) can also be decreased, whereby a filter of a high shape factor having good attenuation characteristics outside the pass band can be realized. However, according to the configuration, the reduction ratio of the Dfp (Dfs) is poor with respect to the number of the withdrawal electrode fingers among the total number of the electrode fingers of the IDT (withdrawing ratio R), and thus the reduction ratio of the Dfp (Dfs) becomes about half of that obtained by withdrawing the electrode fingers periodically with the same value of R.

Therefore, in order to produce the same Δf (shape factor), this procedure requires that the value of R be necessarily about twice that in the procedure where the electrode fingers are periodically withdrawn. Because the electrostatic capacitance is decreased by withdrawing the electrode fingers, the aperture length of the IDT is increased or the number of pairs of the electrode fingers is increased to compensate the reduction in capacitance. In other words, when the value of R is increased twice, the area of the IDT is increased twice or more to cause such a problem that the filter chip size cannot be decreased.

SUMMARY OF THE INVENTION

The invention provides a surface acoustic wave resonator comprising a piezoelectric substrate having formed thereon at least one interdigital transducer, the at least one interdigital transducer comprising a prescribed number of interdigitated electrode fingers, at least two electrode fingers among the interdigitated electrode fingers being withdrawn out, and positions of the withdrawal electrode fingers being aperiodic.

According to the invention, the resonance frequency and the antiresonance frequency of the surface acoustic wave resonator can be made close to each other, whereby a compact surface acoustic wave filter having a high shape factor of the surface acoustic wave filter with suppressed spurious outside the pass band can be provided.

BRIEF DESCRIPTION OF THE DRAWINGS

FIGS. 3A and 3B are graphs showing pass characteristics of a conventional ladder type SAW filter.

DESCRIPTION OF THE PREFERRED EMBODIMENTS

Figure 1:
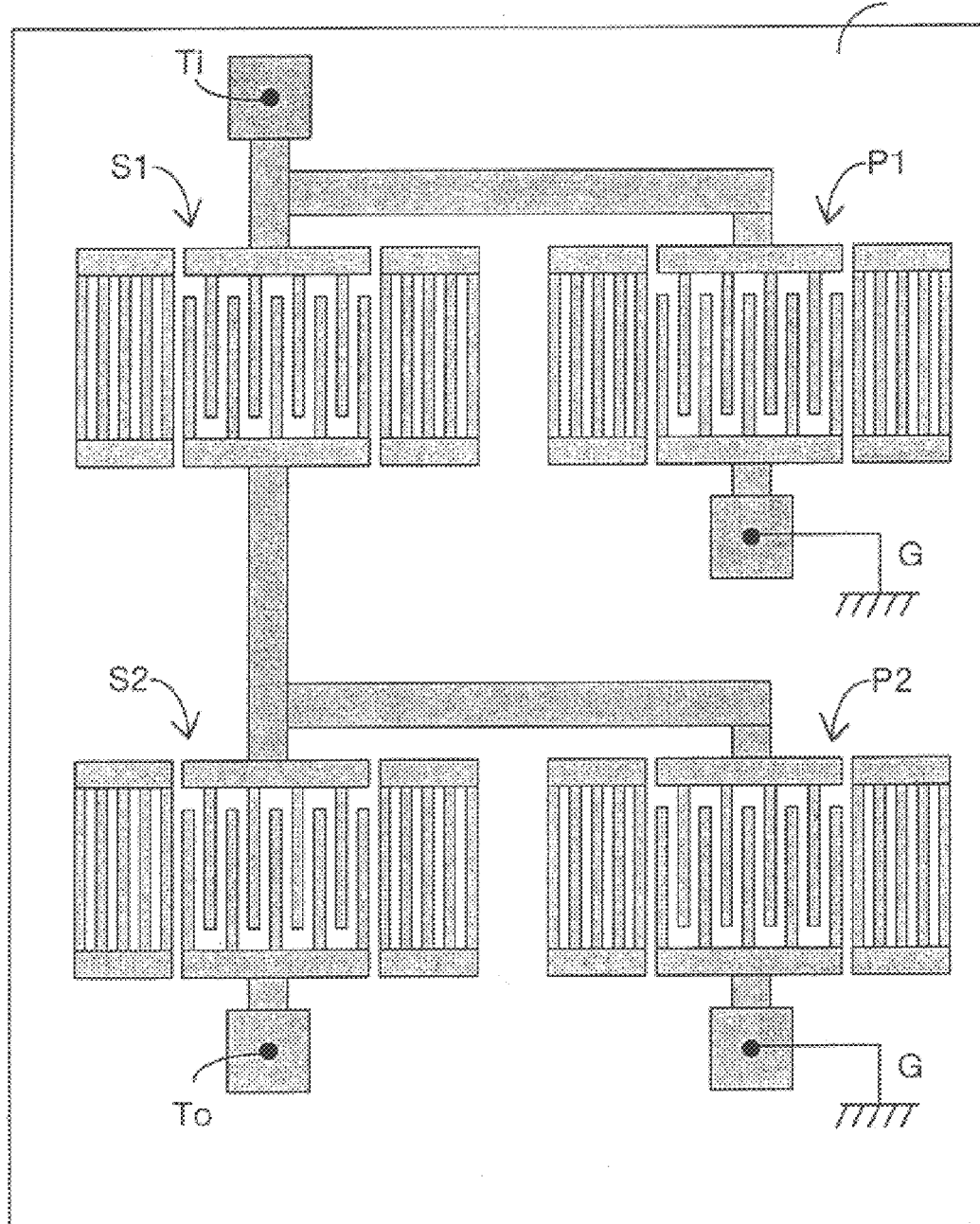
FIG. 1 is a constitutional diagram showing a conventional ladder type SAW filter.

The invention provides a surface acoustic wave resonator, in which the structure of the surface acoustic resonator used in a surface acoustic wave filter is modified, whereby the difference in frequency between the resonance frequency and the antiresonance frequency of the surface acoustic wave resonator can be reduced, spurious outside the pass band can be reduced, and the filter chip size can be decreased, and provides a surface acoustic wave filter using the same.

In order to decrease an excitation efficiency effectively, it is preferred in the invention that the number of electrode fingers N lying between the withdrawal electrode fingers are represented by the following expression:

$$1 \leq N \leq 0.4 \times (Ra-Rm-4)$$

wherein Ra represents the total number of electrode fingers none of which are withdrawn and Rm represents the number of the withdrawal electrode fingers.

It may be possible that the predetermined number of interdigitated electrode fingers of the interdigital transducer are divided into at least three regions each having a substantially equivalent number of the electrode fingers viewed from a direction in parallel to a propagation direction of a surface acoustic wave to be excited, and the interdigitated electrode fingers are withdrawn so that average normalized excitation intensities of the divided regions are substantially equal to each other. (in at least one of the number of the divided regions).

According to the invention, the predetermined number of interdigitated electrode fingers of the interdigital transducer may be divided into at least three regions each having a substantially equivalent number of the electrode finger viewed from a direction in parallel to a propagation direction of a surface acoustic wave to be excited, and a difference between the maximum number and the minimum number of the electrode fingers withdrawn from the divided regions is two or less. (in at least one of the number of the divided regions).

In the above-described surface acoustic wave resonator, the number of the withdrawal electrode fingers may be from 2 to 22% of the total number of electrode fingers none of which are withdrawn.

Further, in the above-described surface acoustic wave resonator, pseudo withdrawal electrode fingers, which do not contribute to excitation of a surface acoustic wave, may be formed at the positions from which the electrode fingers are withdrawn.

Still further, in the above-described surface acoustic wave resonator, reflectors may be closely arranged on both sides of the interdigital transducer in a direction in parallel to a propagation direction of a surface acoustic wave to be excited.

Moreover, for providing a surface acoustic wave filter comprising a piezoelectric substrate, a plurality of surface acoustic wave resonators which are formed on the piezoelectric substrate and electrically connected to each other in a ladder form, at least one of the surface acoustic wave resonators may be a surface acoustic wave resonator according to the present invention.

As to this invention, the excitation efficiency herein means a transduction coefficient defined in the general coupling-of-modes theory and indicates an excitation efficiency by a voltage applied to the IDT (see "Introduction to Surface Acoustic Wave (SAW) Device Simulation Technique", p. 216, by K. Hashimoto Published by Realize Co., Ltd. (1997)).

The invention will be described in detail below with reference to embodiments shown in the drawings, but the invention is not construed as being limited thereto.

The constitution and characteristics of the SAW resonator of the invention will be described with comparison to the conventional one-port surface acoustic wave resonator.

Figure 2:
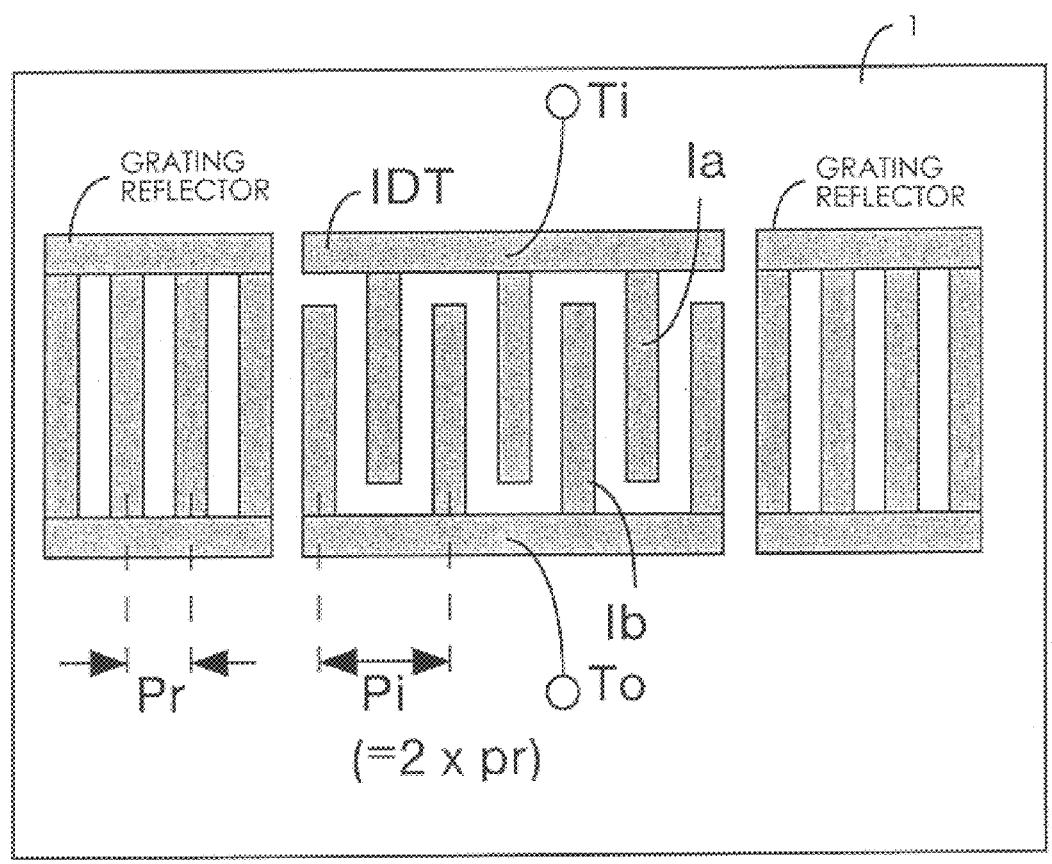
FIG. 2 is a constitutional diagram showing a conventional one-port SAW resonator.
Figure 4:
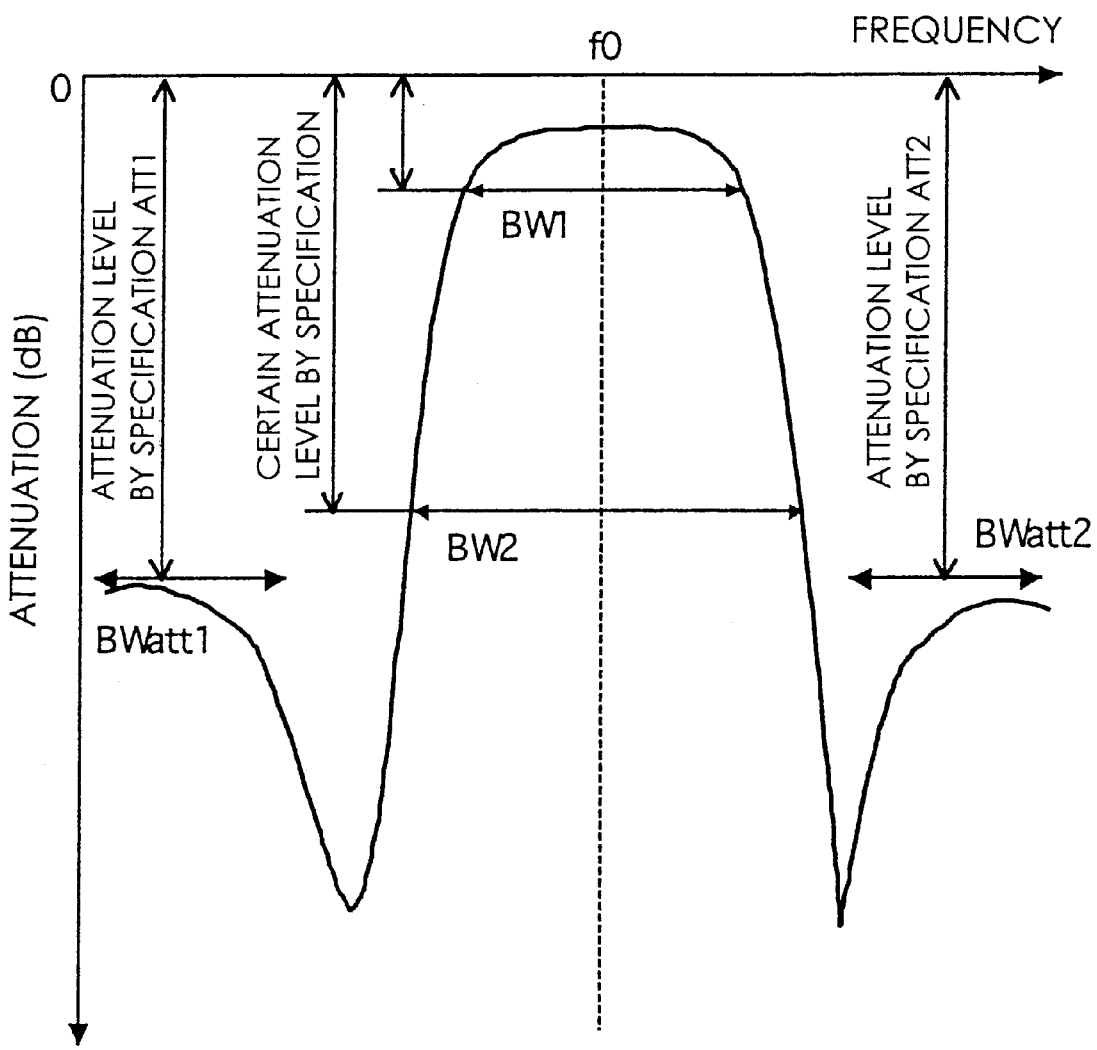
FIG. 4 is an explanatory diagram showing frequency characteristics demanded for a band pass filter.

In the conventional SAW resonator shown in FIG. 2, grating reflectors (period pr) are formed, for example, with an AL thin film, on the both sides of the IDT (period pi) on a piezoelectric substrate. It is designed in such a manner that pi/2 and pr substantially agree to each other, and sharp resonance is realized at the frequency f (f=v/pi) determined by the period pi of the IDT and the velocity v of the surface acoustic wave. When the resonance characteristics are obtained by utilizing internal reflection of the SAW of the IDT itself, there are cases where no reflector is provided.

Figure 5:
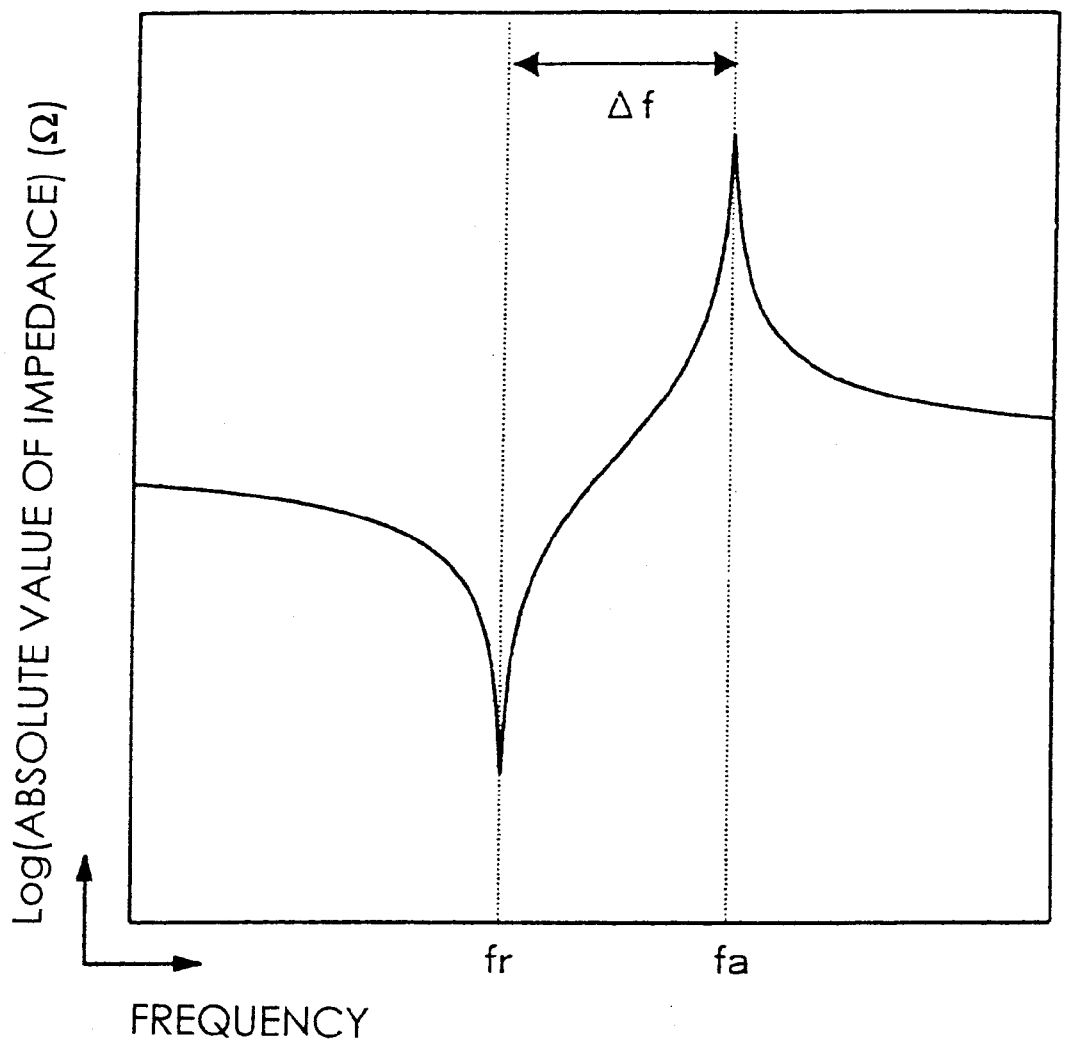
FIG. 5 is a graph showing impedance characteristics of a conventional SAW resonator.

FIG. 5 is a graph showing an impedance characteristic diagram of the conventional SAW resonator. In general, an SAW resonator exhibits double resonance characteristics having a resonance frequency fr and an antiresonance frequency fa as shown in FIG. 5. The symbol Δf in the figure indicates the difference of the two frequencies.

A ladder type SAW filter has such a constitution that a number of surface acoustic wave resonators are connected in parallel and serial as shown in FIG. 1, and the IDT of the resonator is designed in such a manner that the antiresonance frequency fap of the parallel-arm SAW resonators $P_1$ and $P_2$ substantially agree with the resonance frequency frs of the series-arm SAW resonators $S_1$ and $S_2$ (see FIG. 3).

In order to improve the shape factor among the filter characteristics, it is necessary to decrease the frequency difference Δf (=fa−fr) between the antiresonance frequency fa and the resonance frequency fr of the SAW resonator as described in the foregoing.

The coupling-of-modes theory has been generally known, and simulation for an SAW filter is conducted by the theory. As a result, it has been found that when the value of the transduction coefficient ζ is made small, the antiresonance frequency fa is moved to the low frequency side to reduce the frequency difference Δf between fa and fr.

Figure 6:
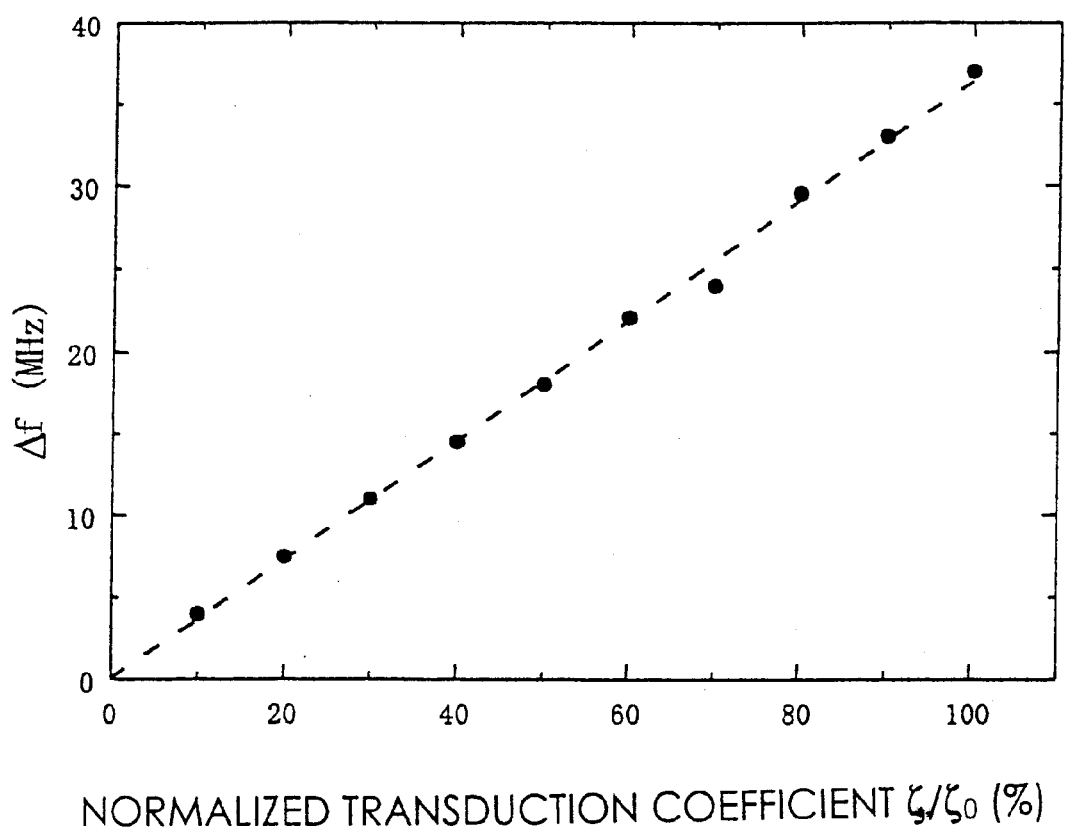
FIG. 6 is a graph showing the change of the frequency difference Δf with respect to the normalized transduction coefficient.

FIG. 6 is a graph showing the change of the frequency difference Δf (MHz) between the resonance point and the antiresonance point with respect to the normalized transduction coefficient $\zeta/\zeta_0$ (%). A SAW resonator of the 800 MHz band is considered therein. The normalized transduction coefficient $\zeta/\zeta_0$ means a transduction coefficient normalized with the transduction coefficient $\zeta_0$ of the ordinary design. It indicates that the smaller the normalized transduction coefficient $\zeta/\zeta_0$, the poorer the excitation efficiency is.

It has been found by simulation using the coupling-of-modes theory that, according to FIG. 6, when the excitation efficiency of the SAW in the IDT of the SAW resonator is made small, the antiresonance frequency fa moves to the low frequency side to make Δf small. In other words, when excitation of the SAW in the IDT is suppressed, the frequency difference Δf between the resonance point and the antiresonance point is decreased, whereby the shape factor can be made high.

An example of a SAW resonator will be described below, by which the frequency difference Δf between the resonance point and the antiresonance point can be effectively decreased, so as to suppress the spurious and to increase the shape factor.

Figure 7:
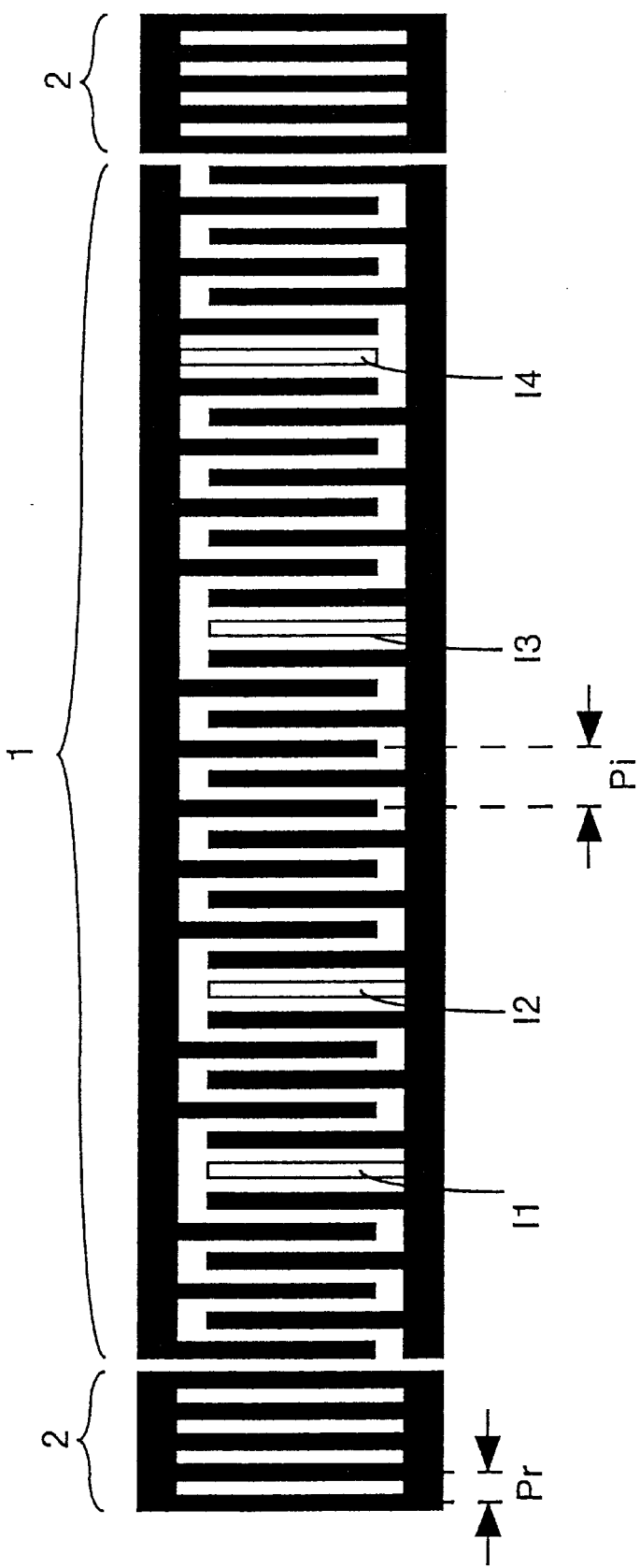
FIG. 7 is a constitutional diagram showing one example of a one-port SAW resonator according to the invention.

FIG. 7 is a constitutional diagram showing one example of a one-port SAW resonator according to the invention.

In FIG. 7, four (=Rm) pseudo withdrawal electrode fingers (I1 to I4) are provided among an IDT (total number of electrode fingers: 40=Ra). The withdrawing ratio R is 4/40= 10 (%). It is configured that the numbers of electrode fingers N present between the pseudo withdrawal electrode fingers satisfies the equation: 1≦N≦0.4(40−4−4)=12.8. For example, in FIG. 7, the number of electrode fingers between the pseudo withdrawal electrode fingers $I_1$ and $I_2$ is 5, and the number of electrode fingers between the pseudo withdrawal electrode fingers $I_2$ and $I_3$ is 11.

In the IDT of the one-port SAW resonator of the ordinary design, in which all the electrode fingers are periodically arranged, the electrode fingers Ia connected to the upper terminal and the electrode fingers Ib connected to the lower terminal are alternately arranged. On the other hand, the pseudo withdrawal electrode finger in the invention means an electrode finger that is connected to the terminal opposite to the terminal to be connected in the ordinary design.

Inverted voltages are applied to the upper terminal and the lower terminal of the IDT. Owing to the inverted polarity of the connected terminal, no surface acoustic wave is excited by the pseudo withdrawal electrode fingers (I1 to I4). Therefore, the pseudo withdrawal electrode fingers are connected to the terminal opposite to the terminal to be connected in the ordinary design as shown in FIG. 7, or in alternative, the electrode fingers positioned at I1 to I4 in FIG. 7 may be completely removed, so as to obtain the SAW resonator of the same characteristics.

The surface acoustic wave is not excited in the region where the pseudo withdrawal electrode fingers are formed or the electrode fingers are withdrawn out, and the excitation efficiency of the SAW of the total IDT is decreased. The decrease in excitation efficiency brings about decrease in transduction coefficient ζ in FIG. 6.

Figure 8:
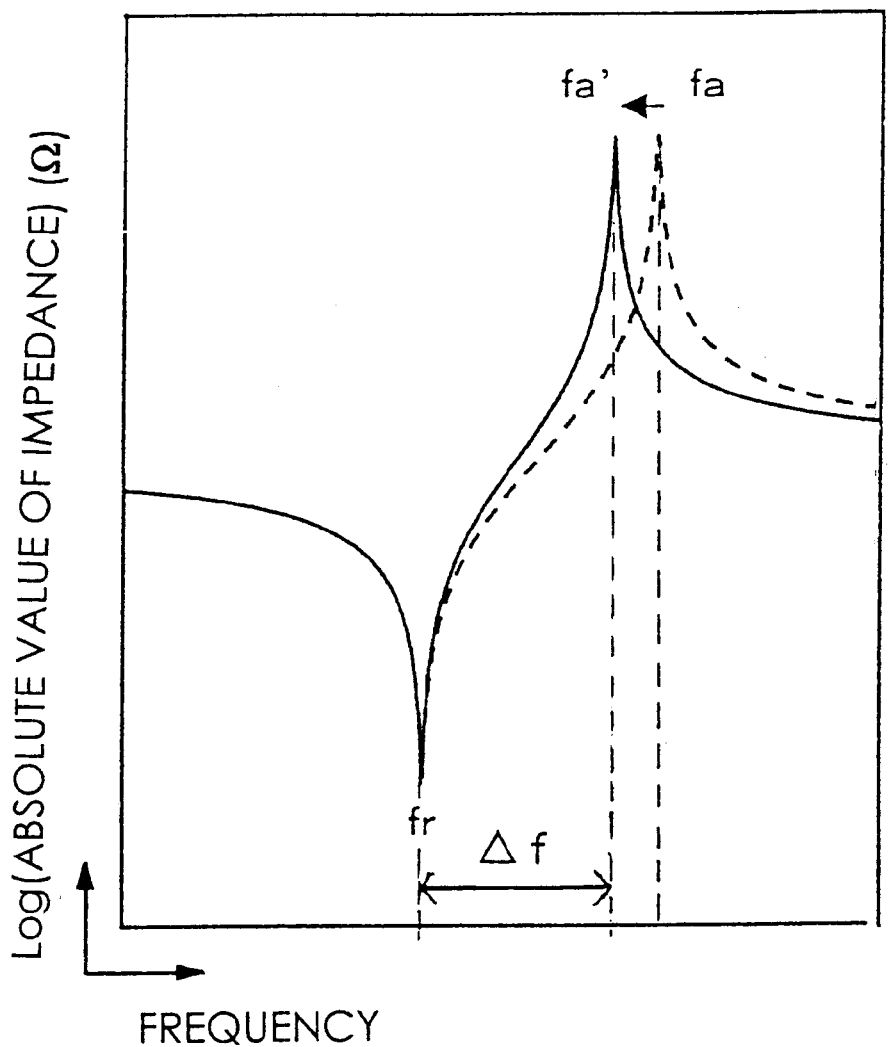
FIG. 8 is a graph showing the impedance characteristics of a one-port SAW resonator according to the invention.

FIG. 8 is a graph showing the impedance characteristics of the withdrawal SAW resonator shown in FIG. 7. The solid line denotes the SAW resonator of the invention shown in FIG. 7, whereas the broken line denotes the conventional SAW resonator shown in FIG. 2. As a result of the decrease of the transduction coefficient ζ, the impedance characteristics of the SAW resonator has an antiresonance frequency fa shifted to the low frequency side (from fa to fa') to make Δf small as shown in FIG. 8.

From the standpoint of decreasing the filter chip size, it is preferred that when the interdigitated electrode fingers are divided into at least three regions, each of which has a substantially equivalent number of electrode fingers viewed from a direction in parallel to the propagation direction of the surface acoustic wave to be excited by the IDT, the interdigitated electrode fingers are withdrawn, or pseudo withdrawal electrode fingers are provided, whereby average normalized excitation intensities of the SAW in the respective divided regions are substantially equal to each other in all the divided regions.

Figure 9:
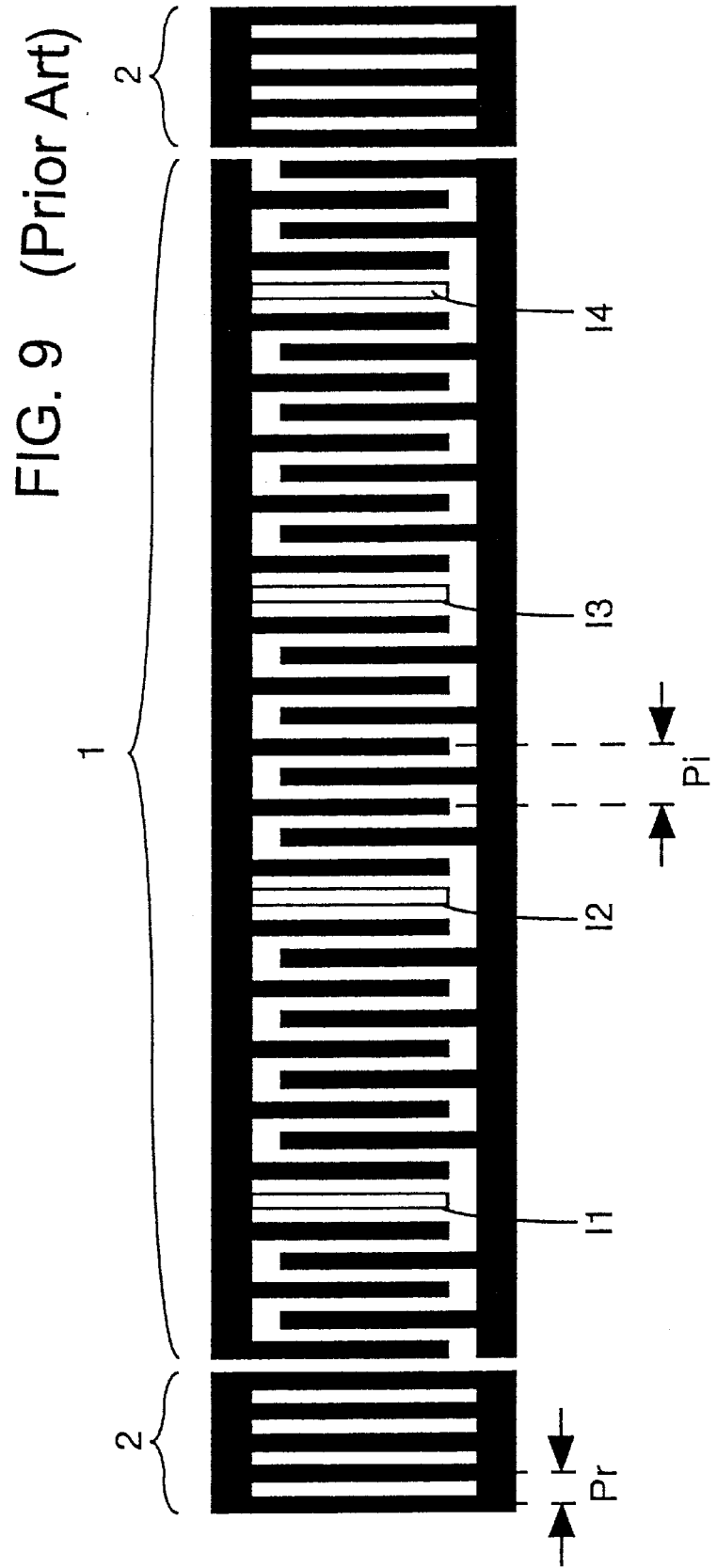
FIG. 9 is a constitutional diagram showing a SAW resonator, in which pseudo withdrawal electrode fingers are periodically provided in a conventional SAW resonator.

FIG. 9 shows the structure of a SAW resonator, in which pseudo withdrawal electrode fingers (I1 to I4) are periodically provided in the conventional SAW resonator. The total number of the electrode fingers in the IDT is 40, and the number of the pseudo withdrawal electrode fingers is 4. The SAW resonator has the same withdrawal ratio R=4/40=10 (%) as the SAW resonator of the invention shown in FIG. 7.

Figure 10:
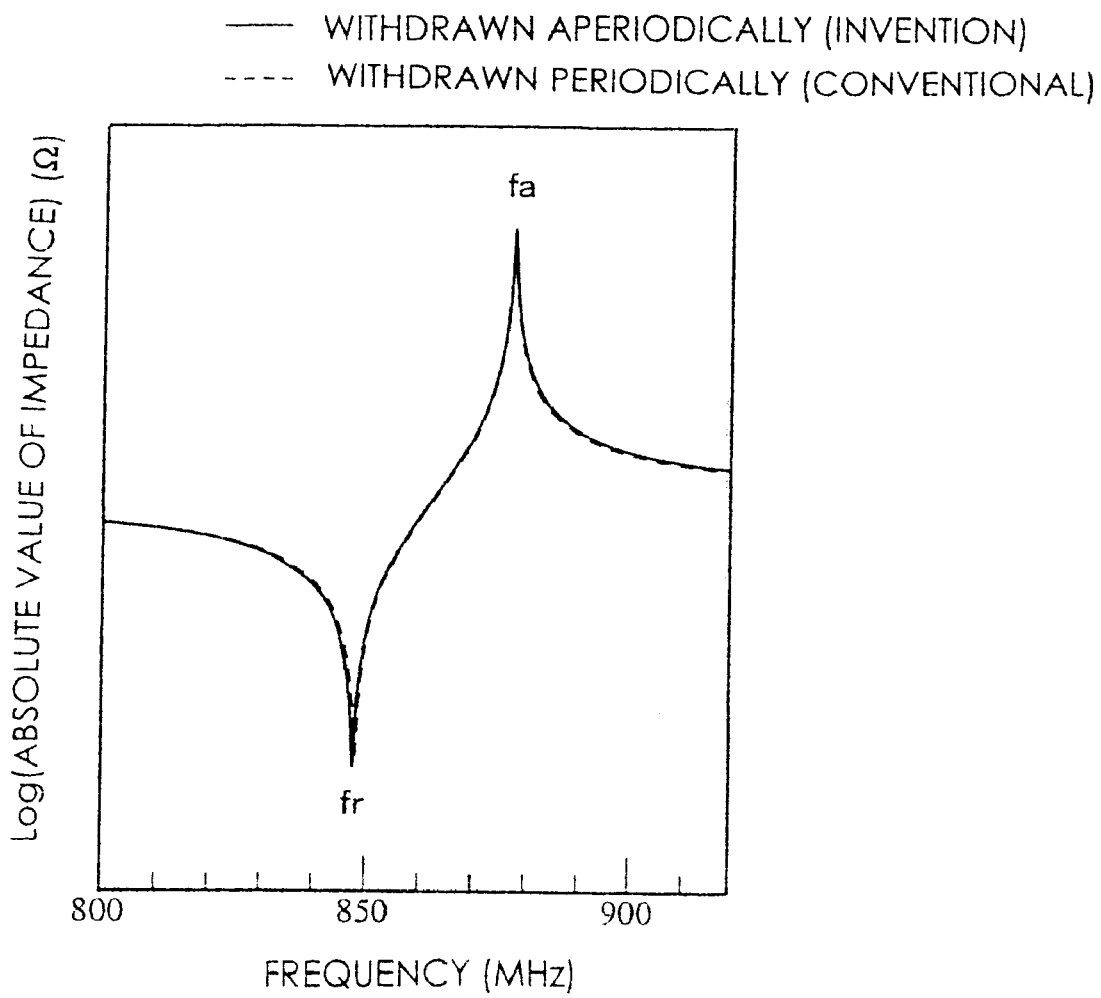
FIG. 10 is a graph showing the comparison of the impedance characteristics between a conventional resonator and a resonator according to the invention.

FIG. 10 is a graph showing the comparison of the impedance characteristics between the resonator having pseudo withdrawal electrode fingers periodically provided shown in FIG. 9 and the impedance characteristics of the SAW resonator of the invention shown in FIG. 7. It is understood that because of the same withdrawal ratio R, the transduction coefficient $\zeta$ is decreased in the same extent, and $\Delta f$ is decreased in the same extent.

Figure 11:
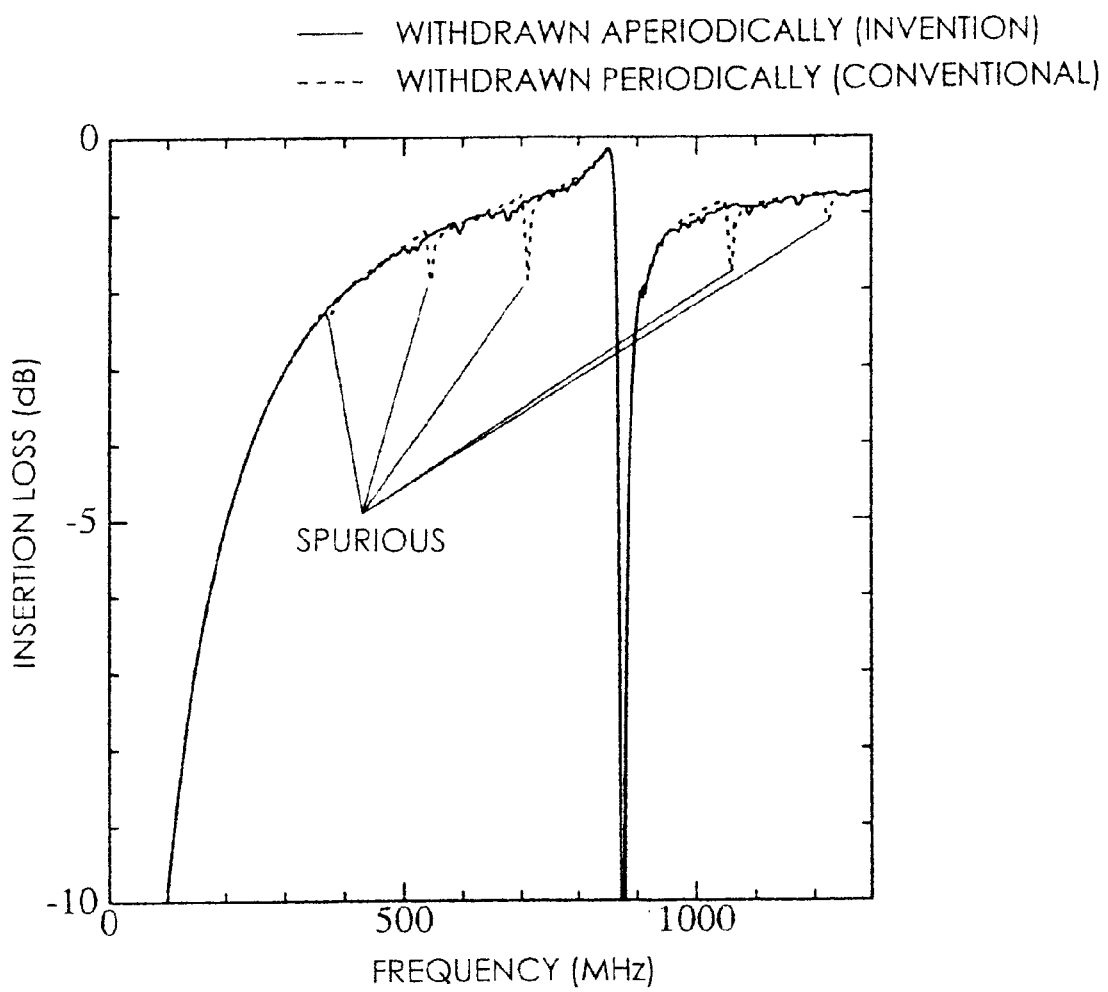
FIG. 11 is a graph showing the comparison of the pass characteristics between a conventional resonator and a resonator according to the invention.

FIG. 11 is a graph showing the comparison of the pass characteristics measured over the wide band between the conventional SAW resonator having the pseudo withdrawal electrode fingers periodically provided shown in FIG. 9 and the SAW resonator of the invention shown in FIG. 7. Upon viewing over the wide band, it is understood that spurious (shown by the broken line) is caused at even intervals by the periodicity of the withdrawal positions in the conventional resonator having the pseudo withdrawal electrode fingers periodically provided shown in FIG. 9.

On the other hand, it is understood that spurious outside the pass band is remarkably suppressed in the SAW resonator of the invention shown in FIG. 7 owing to the uneven numbers of the electrode fingers present between the withdrawal electrode fingers (shown by the solid line).

It is understood from the foregoing that the spurious outside the pass band can be suppressed with the same reduction effect of $\Delta f$, so as to provide an excellent resonator structure, by the withdrawal electrode fingers aperiodically provided (i.e., the numbers of electrode fingers present between the withdrawal electrode fingers are not constant) rather than the withdrawal electrode fingers periodically provided.

Figure 12:
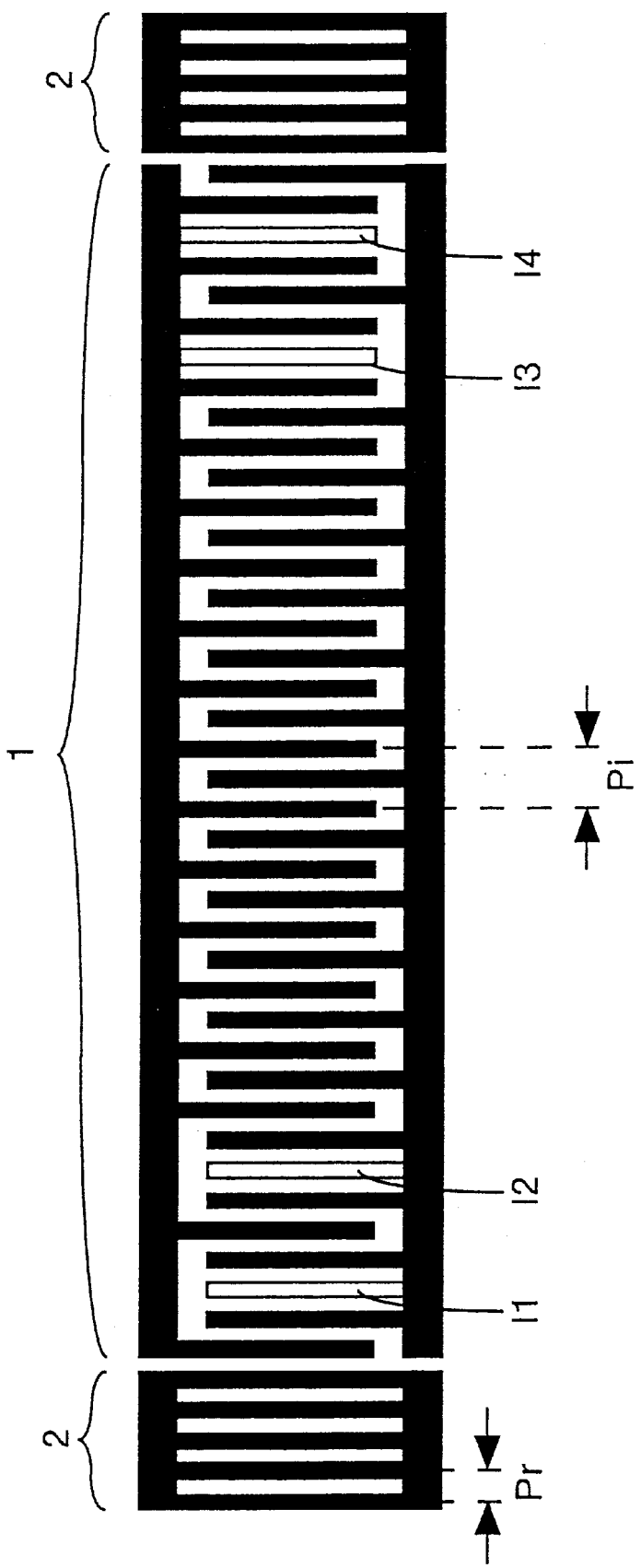
FIG. 12 is a constitutional diagram showing a conventional SAW resonator, in which pseudo withdrawal electrode fingers are provided in a larger number in the outside.

FIG. 12 shows the structure of the conventional SAW resonator, in which pseudo withdrawal electrode fingers are provided in a larger number in the outside of the IDT. The total number of the electrode fingers in the IDT is 40, and the number of the pseudo withdrawal electrode fingers is 4 (I1 to I4). The SAW resonator has the same withdrawing ratio R=4/40=10 (%) as the SAW resonator of the invention shown in FIG. 7.

Figure 13:
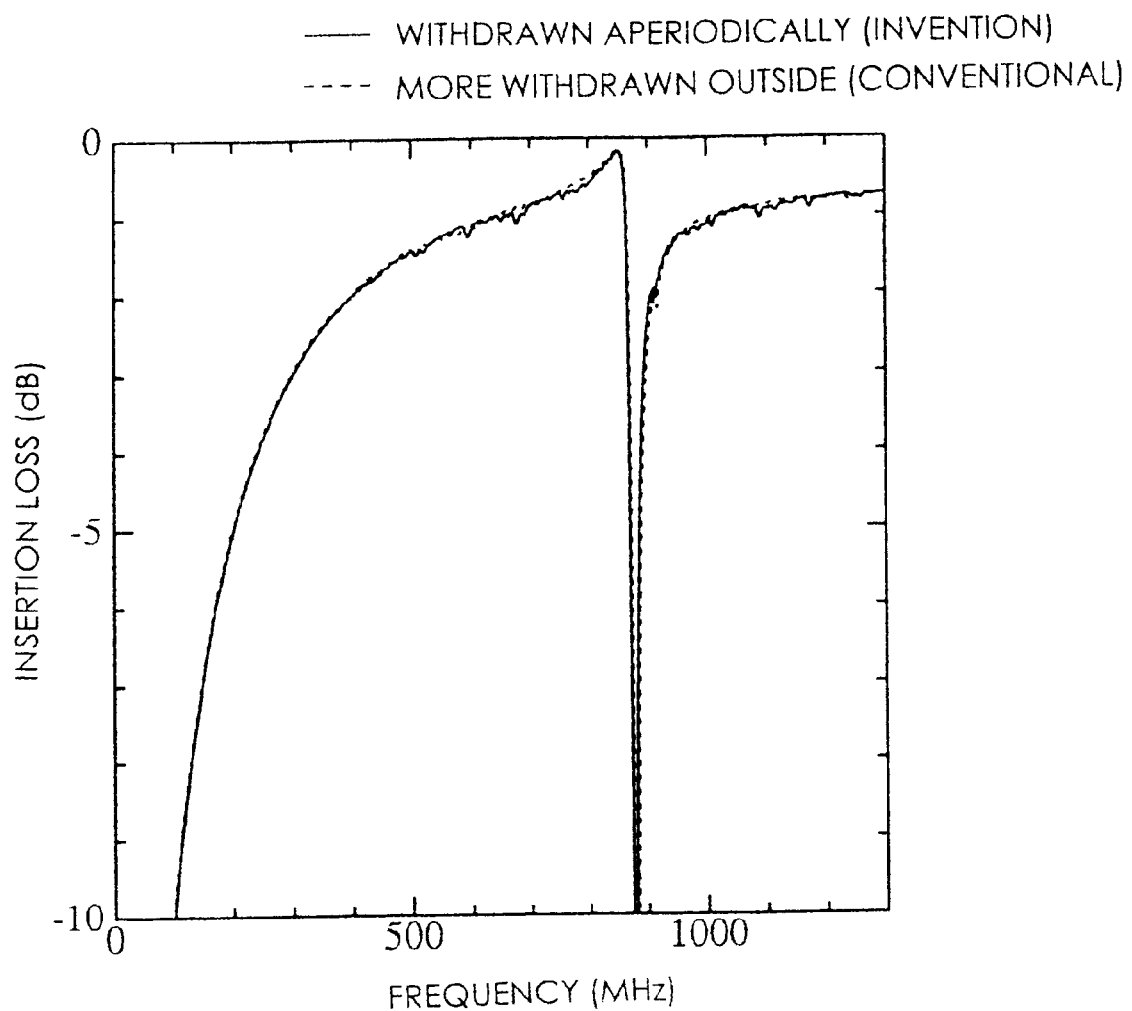
FIG. 13 is a graph showing the comparison of the pass characteristics between a conventional resonator and a resonator according to the invention.

FIG. 13 is a graph showing the comparison between the pass characteristics measured over the wide band for the SAW resonator having the pseudo withdrawal electrode fingers provided in a larger number in the outside shown in FIG. 12 and the SAW resonator of the invention shown in FIG. 7. No spurious is observed outside the pass band for both the resonators owing to the aperiodic withdrawal positions.

Figure 14:
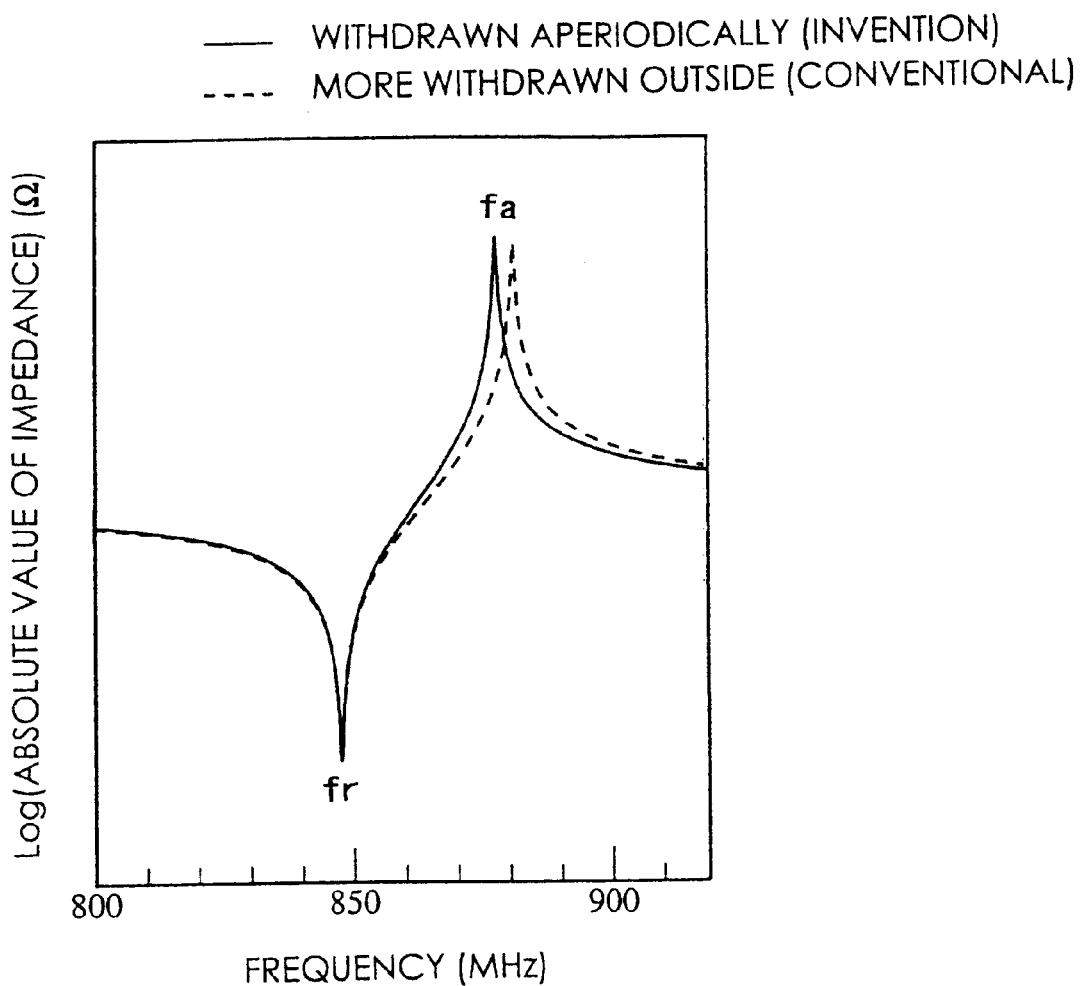
FIG. 14 is a graph showing the comparison of the impedance characteristics between a conventional resonator and a resonator according to the invention.

FIG. 14 is a graph showing the comparison between the impedance characteristics of the resonator having the pseudo withdrawal electrode fingers provided in a larger number in the outside shown in FIG. 12 and the SAW resonator of the invention shown in FIG. 7. It is understood that although the withdrawing ratios R are the same as each other, $\Delta f$ of the resonator having the pseudo withdrawal electrode fingers provided in a larger amount in the outside shown in FIG. 12 (shown by the broken line) is not so much decreased.

It is understood from the foregoing that the spurious outside the pass band can be suppressed with the better reduction effect of $\Delta f$, so as to provide an excellent resonator structure, by the pseudo withdrawal electrode fingers aperiodically provided, i.e., the numbers of electrode fingers present between the pseudo withdrawal electrode fingers are not constant (SAW resonator shown in FIG. 7) rather than the pseudo withdrawal electrode fingers provided in a larger number in the outside of the IDT.

Since the SAW resonator of the invention shown in FIG. 7 has R=10%, the decreasing ratio of the electrostatic capacitance of the IDT caused by the withdrawing is about 20%. The increasing ratio of the area of the IDT for compensating it is 1/(1−0.2)=1.25 (times).

On the other hand, in order to obtain the same extent of the decreasing effect of Df as the SAW resonator of the invention shown in FIG. 7 by the resonator having the pseudo withdrawal electrode fingers provided in a larger amount in the outside shown in FIG. 12, the withdrawing ratio is necessarily about twice R=20%). The increasing ratio of the area of the IDT herein is 1/(1−0.4)=1.67 (times). Therefore, a compact SAW filter can be realized by the SAW resonator of the invention shown in FIG. 7 rather than the conventional SAW resonator shown in FIG. 12.

The withdrawing ratio of the electrode fingers will be described below.

The withdrawing ratio R herein is defined by the ratio of the number Rm of withdrawal electrode fingers to the total number Ra of the electrode fingers constituting one IDT. In other words, R is represented by the equation: R=(Rm/Ra)×100 (%). Therefore, in the case where the total number of electrode fingers of the IDT is 100, and the number of the withdrawal electrode fingers is 10, the withdrawing ratio R is 10%. In the case where pseudo withdrawal electrode fingers are provided, the number of the pseudo withdrawal electrode fingers is designated as Rm.

From the standpoint of the characteristics, such as the shape factor, demanded for the SAW filter, it is preferred that the withdrawing ratio R is in the range of 2%≦R≦22%. This is because in the case where the withdrawing ratio R is increase beyond the range, it is not practical since the bandwidth is decreased, and the Q value is deteriorated. When the withdrawing ratio R is less than 2%, substantially no change is observed for $\Delta f$, and no improvement is found in the shape factor.

Figure 15:
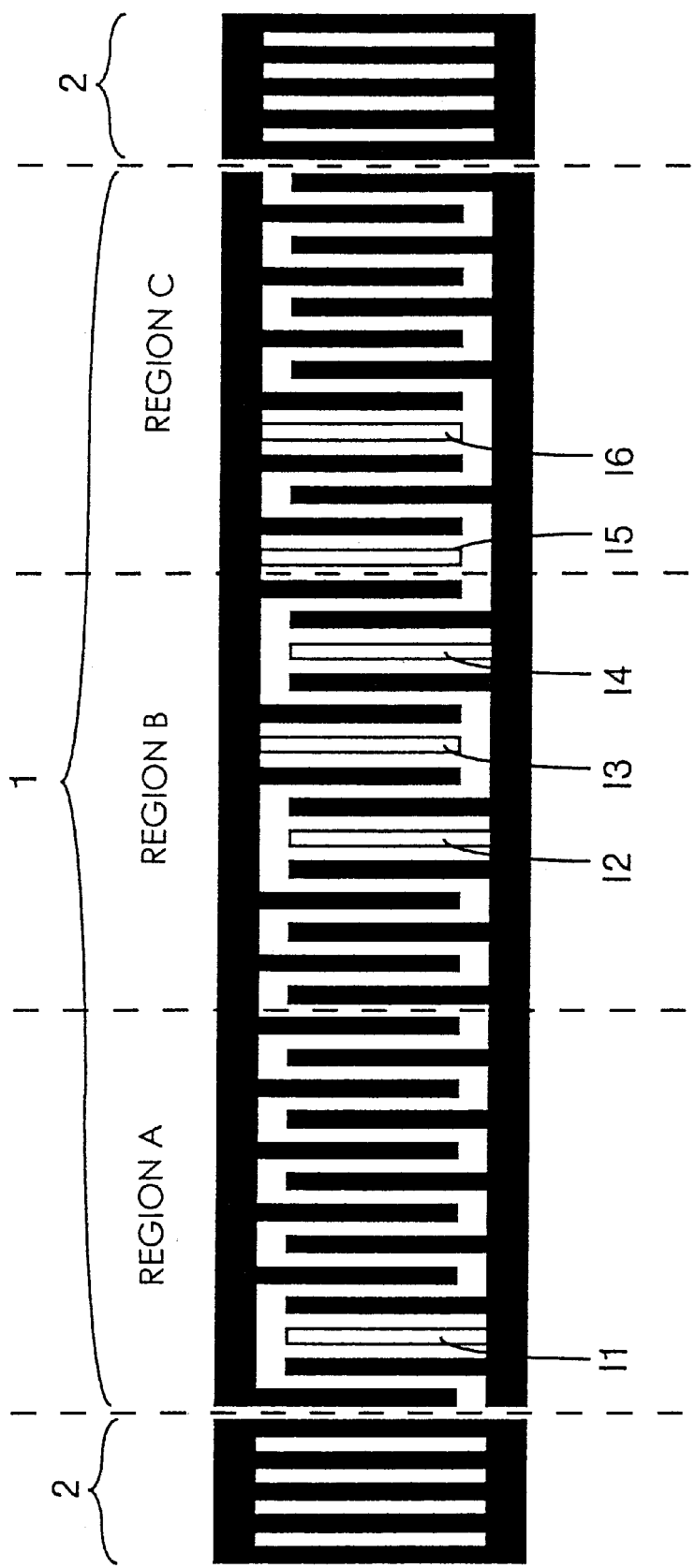
FIG. 15 is a constitutional diagram showing a resonator as another example of the invention.

FIG. 15 is a constitutional diagram showing a resonator as another example of the invention, in which the difference between the maximum value and the minimum value of the numbers of the pseudo withdrawal electrode fingers in the three regions A, B and C of the IDT is two or less, and the numbers of the electrode fingers present between the pseudo withdrawal electrode fingers are not constant.

While the case where the IDT is divided into three regions herein, it is not limited to this, but the IDT may be divided into four or more regions, and it is sufficient that in a number of division of three or more, the difference between the maximum value and the minimum value of the numbers of the pseudo withdrawal electrode fingers in the respective divided regions is two or less.

In FIG. 15, since the maximum value of the pseudo withdrawal electrode finger in the respective divided regions is 3, and the minimum value thereof is 1, the difference therebetween is 2. In the case, as shown herein, where the difference between the maximum value and the minimum value of the withdrawing number in the divided regions is two or less, and the numbers of the electrode fingers present between the pseudo withdrawal electrode fingers are not constant, the resonance and filter characteristics of a high shape factor with no spurious outside the pass band can be obtained as similar to the graph shown by the solid line in FIG. 11.

When the case where the IDT is divided into regions as shown in FIG. 15 is seen from another standpoint, resonance and filter characteristics of a high shape factor with no spurious outside the pass band as shown in FIG. 11 can be obtained by arranging pseudo withdrawal electrode fingers in such a manner that the parameter "average normalized excitation intensity" is substantially equal in all the divided regions.

Figure 16:
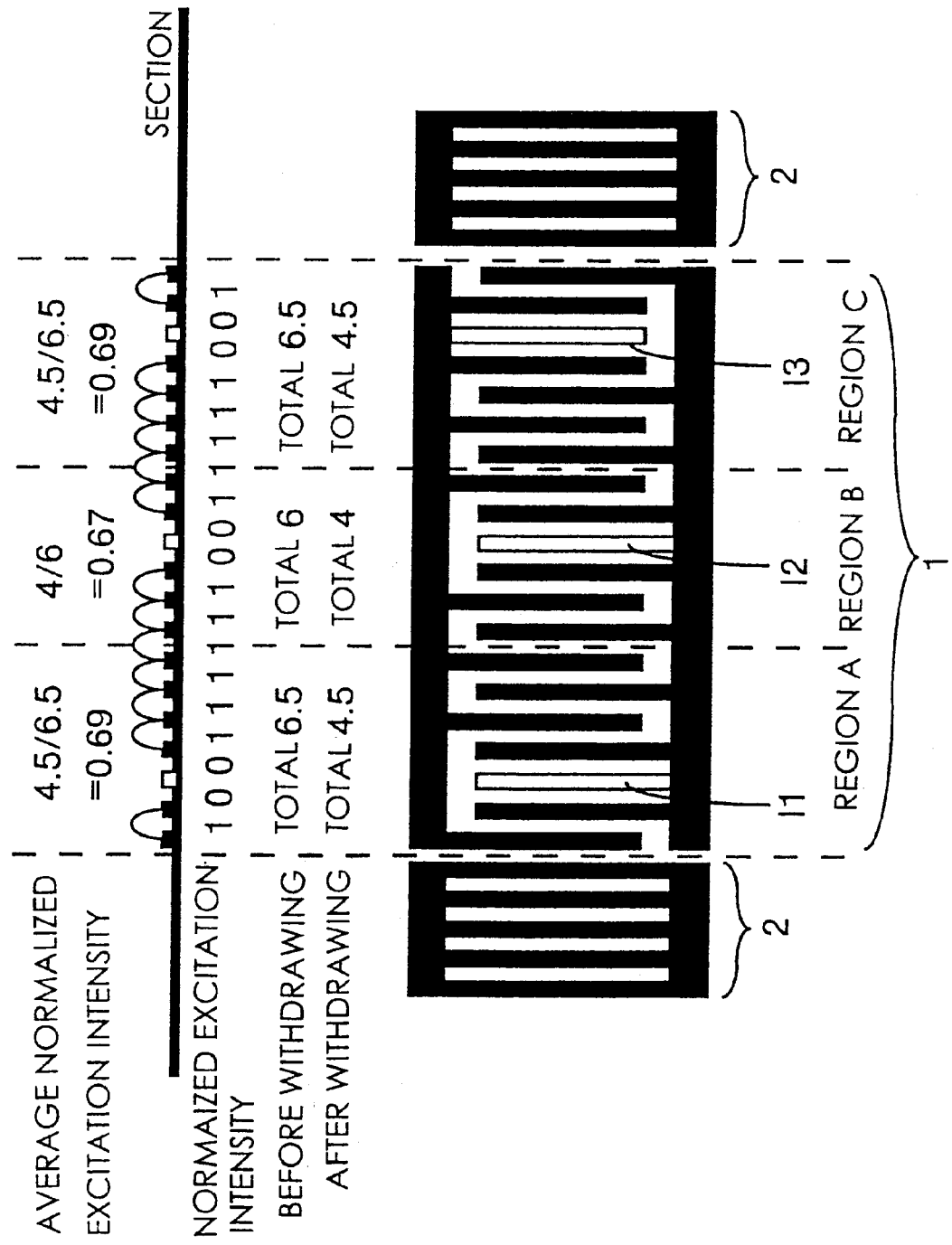
FIG. 16 is a constitutional diagram explaining the average normalized excitation intensity in a SAW resonator according to the invention.

The "average normalized excitation intensity" in the respective divided regions when the IDT is divided into regions will be defined with reference to FIG. 16. FIG. 16 shows an example where an IDT constituted with 20 electrode fingers is divided into three regions having the substantially same numbers of electrodes. The regions A, B and C are constituted with 7, 6 and 7 electrode fingers, respectively. In FIG. 16, only one pseudo withdrawal electrode fingers I1, I2 or I3 is provided in each of the regions A, B and C. When the intensity of the SAW excited between the two adjacent electrode fingers that are not the pseudo withdrawal electrode fingers is defined as a normalized excitation intensity of 1, the resonator of FIG. 16 but having no pseudo withdrawal electrode fingers has the total values of the normalized excitation intensity of 6.5, 6 and 6.5 for each of the divided regions.

In the case where the withdrawal electrode fingers are provided as shown in FIG. 16, because the SAW is not excited between the pseudo withdrawal electrode fingers I1, I2 and I3 and the electrode fingers positioned on the both sides thereof, the normalized excitation intensities between the withdrawal electrode fingers I1, I2 and I3 and the electrode fingers on the both sides thereof are 0. Therefore, when the pseudo withdrawal electrode fingers are provided in the manner shown in FIG. 16, the total values of the normalized excitation intensity are 4.5, 4 and 4.5, respectively. These values are the same in both the case where the pseudo withdrawal electrode fingers are provided and the case where no electrode finger is provided at the positions of the pseudo withdrawal electrode fingers, i.e., the so-called withdrawing is carried out.

Herein, the ratio of the total value of the normalized excitation intensity after providing the pseudo withdrawal electrode fingers with respect to the total value of the normalized excitation intensity before withdrawing is defined as an "average normalized excitation intensity" in the respective regions. In the case shown in FIG. 16, the average normalized excitation intensities in the divided regions A, B and C are 0.69, 0.67 and 0.69, respectively, which are substantially equal to each other in the respective divided regions.

In the case, as shown herein, where pseudo withdrawal electrode fingers are provided or the interdigitated electrode fingers are withdrawn in such a manner that the average normalized excitation intensities of the SAW in all the divided regions are substantially equal to each other, a SAW resonator and a SAW filter with a high shape factor and substantially no spurious can be provided.

It is not necessary that the numbers of the electrode fingers in the divided regions are strictly equivalent, and filter characteristics with a high shape factor can be obtained when upon dividing the electrode fingers into the substantially equivalent numbers, the electrode fingers are withdrawn in such a manner that the difference between the maximum value and the minimum value of the withdrawn numbers in the divided regions is two or less, and the numbers of the electrode fingers present between the withdrawal electrode fingers are not constant.

The number of electrode fingers N present between the withdrawal electrode fingers is preferably in the range $1 \leq N \leq 0.4(Ra-Rm-4)$ as shown in the foregoing. In the case where N is set at a value outside the range, the regions where the SAW is excited and the regions where it is not excited are not scattered, and thus the excitation efficiency over the total IDT cannot be effectively decreased. In other words, when N is set at a value outside the range, the decreasing ratio of $\Delta f$ with respect to the withdrawing ratio is deteriorated, whereby the demanded compact filter is difficult to be produced.

A specific example of the surface acoustic wave filter using the surface acoustic wave resonators of the invention will be described below.

Figure 17:
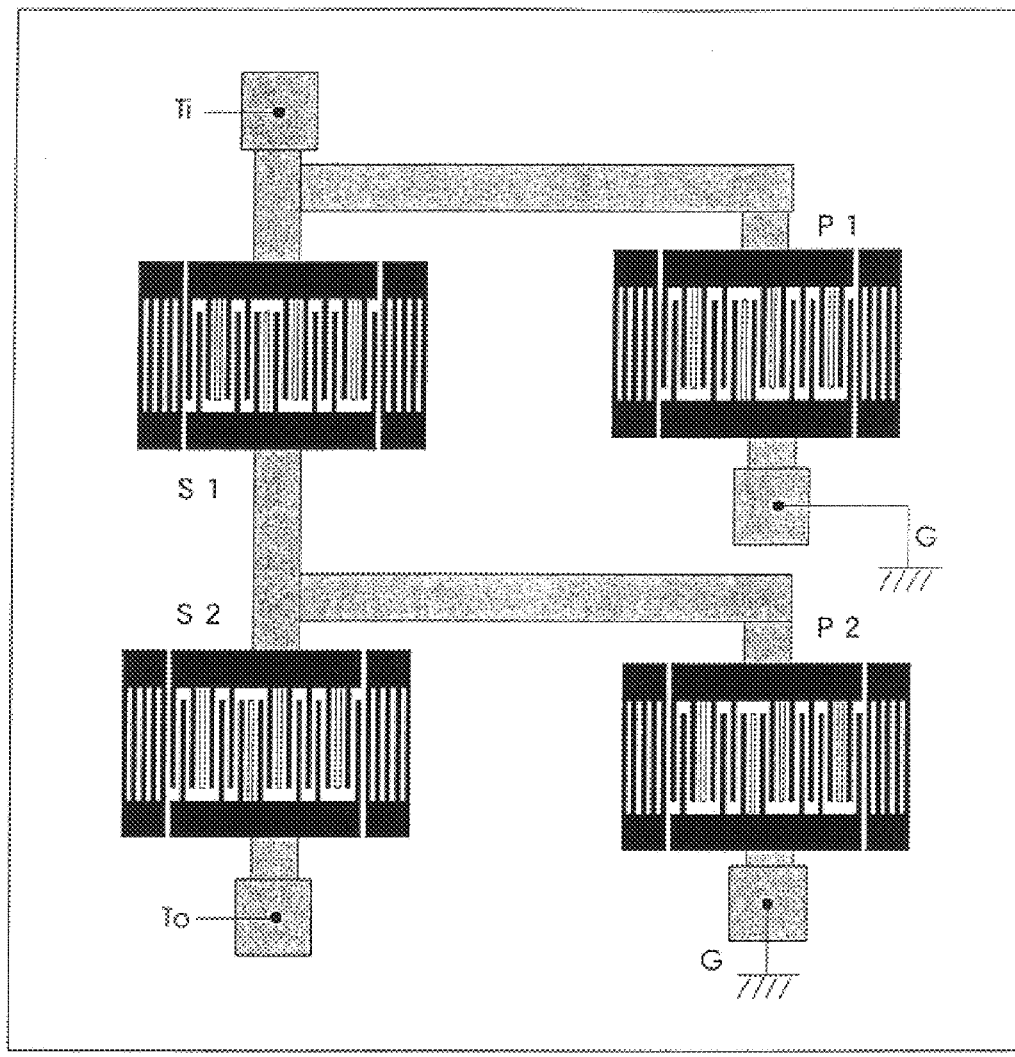
FIG. 17 is a constitutional diagram showing an example of a ladder type SAW filter using SAW resonators of the invention.

FIG. 17 is a constitutional diagram showing an example of a ladder type SAW filter using the surface acoustic wave resonators of the invention.

This is a SAW filter having such a structure that has two series-arm SAW resonators S1 and S2 and two parallel-arm SAW resonators P1 and P2 as similar to the conventional ladder type SAW filter shown in FIG. 1.

The filter is different from the conventional ladder type SAW filter shown in FIG. 1 in the point that the SAW resonators having pseudo withdrawal electrode fingers shown in FIG. 7 are used.

The ladder type SAW filter of the invention is not limited to that shown in FIG. 17, but the SAW resonators of the invention shown in FIG. 7 are used only for the series-arm resonators, and the conventional SAW resonators shown in FIG. 2 are used for the parallel-arm resonators. Furthermore, the SAW resonators shown in FIG. 7 may be used only for the parallel-arm resonators. Moreover, the numbers of the SAW resonators on the series arm and the parallel arm are not limited to those shown in FIG. 17 but may be arbitrary numbers of three or more depending on the demanded performance and specification. The number of the series-arm SAW resonators and the number of the parallel-arm SAW resonators may not be the same as each other.

EXAMPLE 1

A ladder type SAW filter using the SAW resonators of the invention shown in FIG. 7 only for the series-arm SAW resonators will be described.

Herein, on a 42° Y-cut X-propagation LiTaO$_3$ substrate, four SAW resonators in serial and two SAW resonators in parallel are formed to make a ladder type SAW filter.

The SAW resonators connected in series have the constitution shown in FIG. 7, in which the period pi of the IDT is 4.60 μm, the aperture length of the IDT is 133 μm, the number of pairs of the IDT is 116 pairs, the period pr of the reflectors is 2.30 μm, the number of electrode fingers of the reflector is 160, and the withdrawing ratio R of the electrode fingers of the IDT is 12.5%.

The numbers of electrode fingers N present between the pseudo withdrawal electrode fingers are in the range of $1 \leq N \leq 79.6$. Herein, Ra is 232, and Rm is 29.

The SAW resonators connected in parallel have the constitution shown in FIG. 2, in which the period pi of the IDT is 4.80 μm, the aperture length of the IDT is 120 μm, the number of pairs of the IDT is 78 pairs, the period pr of the reflectors is 2.40 μm, and the number of electrode fingers of the reflector is 120.

Figure 18:
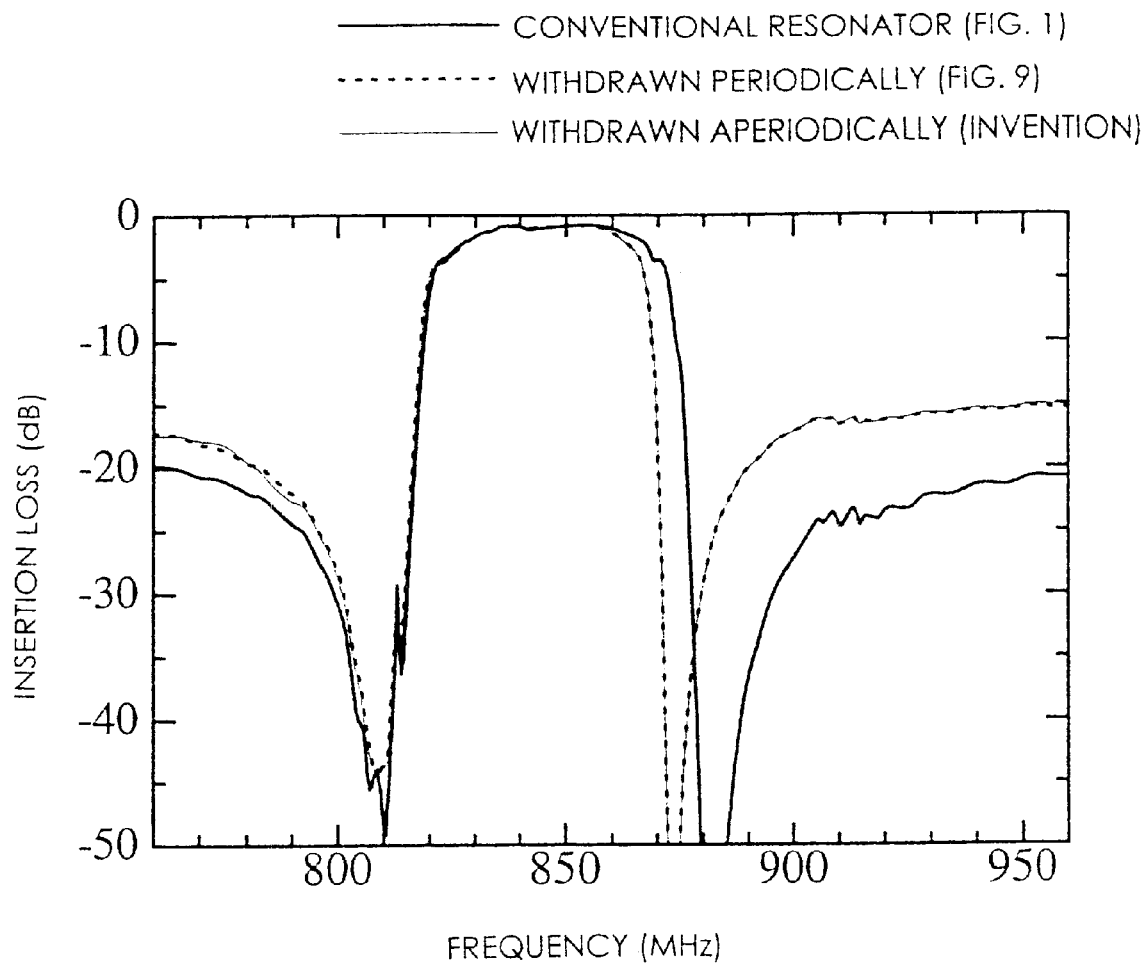
FIG. 18 is a graph showing the comparison of the frequency characteristics between a conventional resonator and the resonator of Example 1 according to the invention.

FIG. 18 shows the comparison of the frequency characteristics among the SAW filter of Example 1, a filter using the conventional resonators having been periodically withdrawn (R=12.5%) shown in FIG. 9 on the series arm, and a SAW filter (shown in FIG. 1) constituted only by the conventional resonators shown in FIG. 2. The thin solid line denotes the frequency characteristics of the SAW filter of the invention, the broken line denotes those of the filter using the resonators having been periodically withdrawn, and the thick solid line denotes those of the conventional SAW filter (shown in FIG. 1).

It is understood from FIG. 18 that both the SAW filter of the invention denoted by the thin solid line and the filter using the resonators having been periodically withdrawn denoted by the broken line exhibit steep declination from the pass region to the attenuation region on the high frequency side, so as to provide an improved shape factor, because the frequency difference $\Delta f$ between the resonance point and the antiresonance point of the series-arm SAW resonators is decreased.

In the case where the similar shape factor characteristics as the invention are to be obtained by the conventional method of withdrawing a larger number of electrode fingers in the outside of the IDT, it is necessary that about 25% of the electrode fingers of the series-arm SAW resonators are withdrawn. At this time, in order to compensate the decrease of the electrostatic capacitance of the IDT, it is necessary that the aperture length of the IDT of the series-arm SAW resonators be broadened to 200 μm. This means increase in area by 35,751 $\mu m^2$ in comparison to the SAW resonators according to the invention (aperture length: 133 μm). Since four SAW resonators are used on the series arm, the increase in area of the total SAW filter is 143,005 $\mu m^2$. Therefore, the conventional SAW resonator is difficult to be miniaturized, and the SAW filter of the invention can be further miniaturized in comparison to the conventional method of withdrawing a large number of electrode fingers in the outside of IDT.

Figure 19:
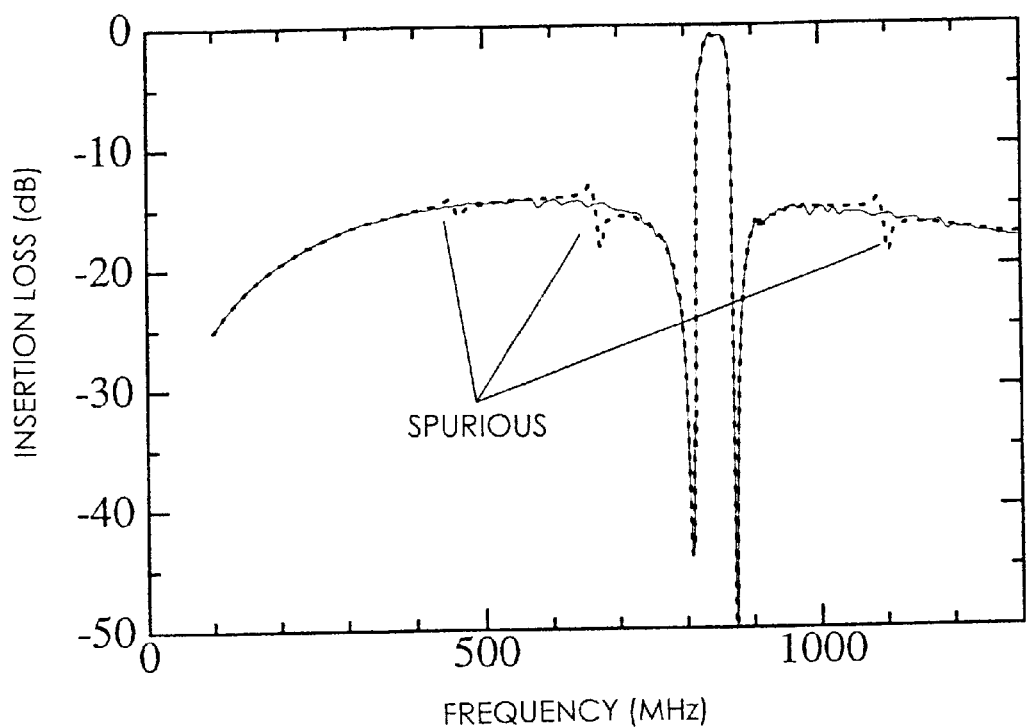
FIG. 19 is a graph showing the comparison of the frequency characteristics between a conventional resonator and the resonator of Example 1 according to the invention.

FIG. 19 shows the comparison of the frequency characteristics measured over the wide band for the ladder type SAW filter of Example 1 of the invention and a conventional filter using resonators having been periodically withdrawn (R=12.5%) on the series arm shown in FIG. 9.

It is understood that the conventional filter using resonators having been periodically withdrawn (shown by the broken line) exhibits plural numbers of spurious outside the pass band, whereas spurious is suppressed in the SAW filter of the invention (shown by the solid line). Therefore, the SAW filter of the invention can realize good attenuation characteristics outside the band rather than the conventional method of periodically withdrawing.

EXAMPLE 2

A ladder type SAW filter using the SAW resonators of the invention shown in FIG. 7 only for the parallel-arm SAW resonators will be described.

Herein, on a 42° Y-cut X-propagation $LiTaO_3$ substrate, four SAW resonators in serial and two SAW resonators in parallel are formed to make a ladder type SAW filter.

The SAW resonators connected in series have the constitution shown in FIG. 2, in which the period pi of the IDT is 4.60 μm, the aperture length of the IDT is 100 μm, the number of pairs of the IDT is 116 pairs, the period pr of the reflectors is 2.30 μm, and the number of electrode fingers of the reflector is 160.

The SAW resonators connected in parallel have the constitution shown in FIG. 7, in which the period pi of the IDT is 4.76 μm, the aperture length of the IDT is 160 μm, the number of pairs of the IDT is 78 pairs, the period pr of the reflectors is 2.38 μm, the number of electrode fingers of the reflector is 120, and the withdrawing ratio R of the electrode fingers of the IDT is 12.5%.

The numbers of electrode fingers N present between the pseudo withdrawal electrode fingers are in the range of $1 \leq N \leq 53.2$. Herein, Ra is 156, and Rm is 19.

Figure 20:
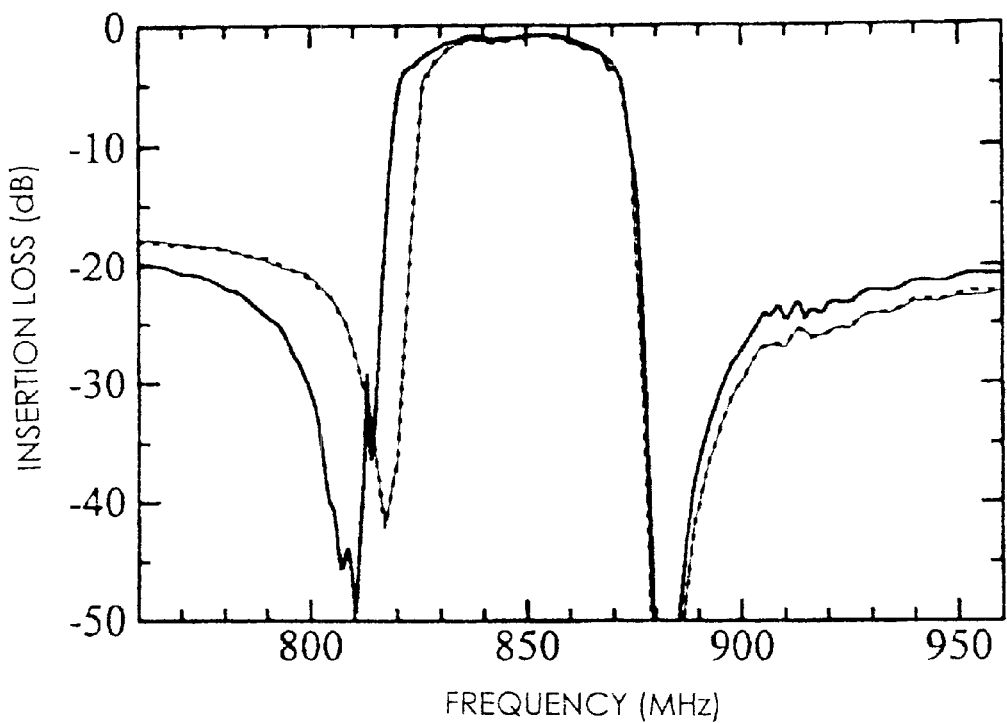
FIG. 20 is a graph showing the comparison of the frequency characteristics between a conventional resonator and the resonator of Example 2 according to the invention.

FIG. 20 shows the comparison of the frequency characteristics among the SAW filter of Example 2, a filter using the conventional resonators having been periodically withdrawn (R=12.5%) shown in FIG. 9 on the parallel arm, and a SAW filter (shown in FIG. 1) constituted only by the conventional resonators shown in FIG. 2. The thin solid line denotes the frequency characteristics of the SAW filter of the invention, the broken line denotes those of the filter using the resonators having been periodically withdrawn, and the thick solid line denotes those of the conventional SAW filter (shown in FIG. 1).

It is understood from FIG. 20 that both the SAW filter of the invention denoted by the thin solid line and the filter using the resonators having been periodically withdrawn denoted by the broken line exhibit steep inclination from the attenuation region of the low frequency side to the pass region, so as to provide an improved shape factor, because the frequency difference $\Delta f$ between the resonance point and the antiresonance point of the parallel-arm SAW resonators is decreased.

In the case where the similar shape factor characteristics as the invention are to be obtained by the conventional method of withdrawing a larger number of electrode fingers in the outside of the IDT, it is necessary that about 25% of the electrode fingers of the parallel-arm SAW resonators are withdrawn. At this time, in order to compensate the decrease of the electrostatic capacitance of the IDT, it is necessary that the aperture length of the IDT of the parallel-arm SAW resonators be broadened to 240 μm. This means increase in area by 29,702 $\mu m^2$ in comparison to the SAW resonators according to the invention (aperture length: 160 μm). Since two SAW resonators are used on the parallel arm, the increase in area of the total SAW filter is 59,404 $\mu m^2$. Therefore, the conventional SAW resonator is difficult to be miniaturized, and the SAW filter of the invention can be further miniaturized in comparison to the conventional method of withdrawing a large number of electrode fingers in the outside of IDT.

Figure 21:
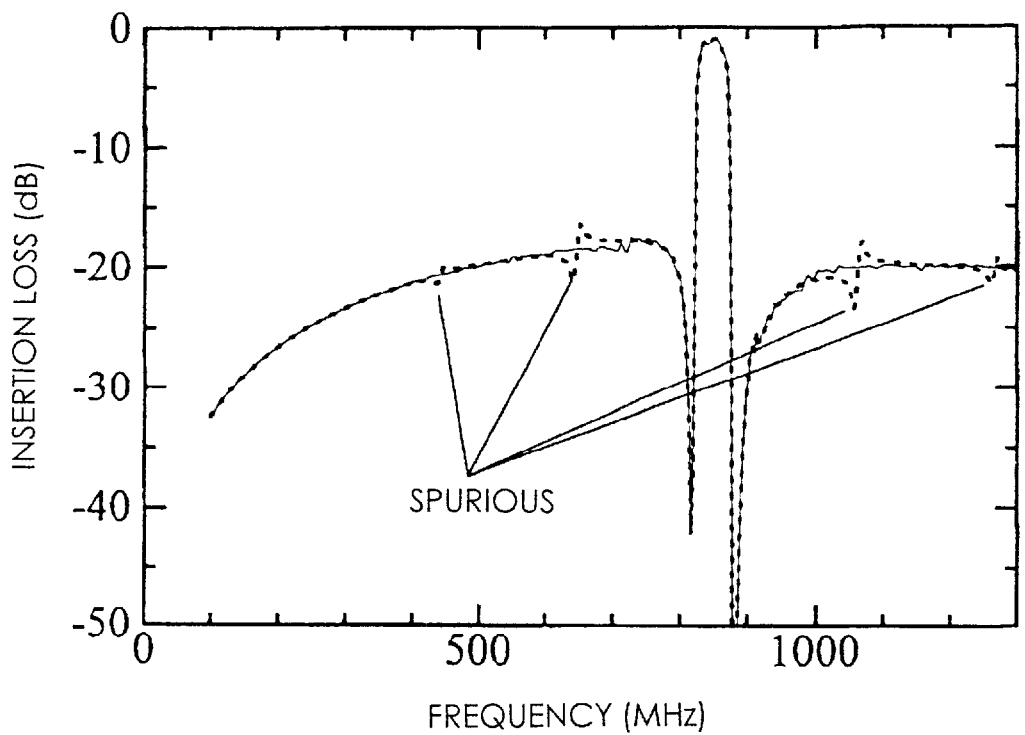
FIG. 21 is a graph showing the comparison of the frequency characteristics between a conventional resonator and the resonator of Example 2 according to the invention.

FIG. 21 shows the comparison of the frequency characteristics measured over the wide band for the ladder type SAW filter of Example 2 of the invention and a conventional filter using resonators having been periodically withdrawn (R=12.5%) on the parallel arm shown in FIG. 9. It is understood that the conventional filter using resonators having been periodically withdrawn (shown by the broken line) exhibits plural numbers of spurious outside the pass band, whereas spurious is suppressed in the SAW filter of the invention (shown by the solid line). Therefore, the SAW filter of the invention can realize good attenuation characteristics outside the band rather than the conventional method of periodically withdrawing.

According to the invention, because electrode fingers are aperiodically withdrawn in the interdigitated electrode fingers constituting the IDT of the surface acoustic wave resonator, the resonance frequency and the antiresonance frequency of the surface acoustic wave resonator can be arbitrarily made close to each other, and thus a surface acoustic wave resonator and a ladder type SAW filter, which have a high shape factor, can be realized.

The spurious outside the pass band, which occurs in the conventional method of periodically withdrawing, can also be suppressed.

Furthermore, because the equivalent decreasing effect of Δf can be obtained by a smaller withdrawing ratio than that of the method of withdrawing a large number of electrode fingers in the outside, the element can be further miniaturized in comparison to the conventional products.

The decrease of Δf, the suppression of spurious, and miniaturization of the surface acoustic wave resonator can be similarly enjoyed in the case where pseudo withdrawal electrode fingers are provided at the positions of the electrode fingers having been aperiodically withdrawn.

What is claimed is:

1. A ladder-form SAW filter comprising:
   a piezoelectric substrate, a plurality of surface acoustic wave resonators which are formed on the piezoelectric substrate and electrically connected in a ladder form;
   wherein the surface acoustic wave resonators each comprise an interdigital transducer and reflectors closely arranged on both sides of the interdigital transducer in a direction in parallel to a propagation direction of an excited surface acoustic wave;
   the interdigital transducer comprises a predetermined number of interdigitated electrode fingers, at least two of the interdigitated electrode fingers are withdrawn, and the positions of the withdrawal electrode fingers are aperiodic; and
   at least one electrode is withdrawn in a central region when the predetermined number of interdigitated electrode fingers are divided into three regions so that a number of the electrode fingers in the three regions are equal in the direction in parallel to the propagation direction of the excited surface acoustic wave.

2. A surface acoustic wave resonator according to claim 1, wherein the predetermined number of interdigitated electrode fingers of the interdigital transducer are divided into at least three regions each having a substantially equivalent number of the electrode fingers viewed from a direction in parallel to a propagation direction of a surface acoustic wave to be excited, and the interdigitated electrode fingers are withdrawn so that average normalized excitation intensities of the divided regions are substantially equal to each other.

3. A surface acoustic wave resonator according to claim 1, wherein the predetermined number of interdigitated electrode fingers of the interdigital transducer are divided into at least three regions each having a substantially equivalent number of the electrode fingers viewed from a direction in parallel to a propagation direction of a surface acoustic wave to be excited, and a difference between the maximum number and the minimum number of the electrode fingers withdrawn from the divided regions is two or less.

4. A surface acoustic wave resonator, comprising:
   at least one interdigital transducer formed on a piezoelectric substrate;
   wherein the at least one interdigital transducer comprises a predetermined number of interdigitated electrode fingers, at least two electrode fingers among the interdigitated electrode fingers are withdrawn, and the positions of the withdrawal electrode fingers are aperiodic; and
   wherein the predetermined number of interdigitated electrode fingers of the interdigital transducer are divided into at least three regions each having a substantially equivalent number of the electrode fingers viewed from a direction in parallel to a propagation direction of a surface acoustic wave to be excited, and the interdigitated electrode fingers are withdrawn so that average normalized excitation intensities of the divided regions are substantially equal to each other.

5. A surface acoustic wave resonator, comprising:
   at least one interdigital transducer formed on a piezoelectric substrate;
   wherein the at least one interdigital transducer comprises a predetermined number of interdigitated electrode fingers, at least two electrode fingers among the interdigitated electrode fingers are withdrawn, and the positions of the withdrawal electrode fingers are aperiodic; and
   wherein the predetermined number of interdigitated electrode fingers of the interdigital transducer are divided into at least three regions each having a substantially equivalent number of the electrode fingers viewed from a direction in parallel to a propagation direction of a surface acoustic wave to be excited, and a difference between the maximum number and the minimum number of the electrode fingers withdrawn from the divided regions is two or less.

6. A surface acoustic wave resonator according to any one of claims 4 or 5, wherein pseudo withdrawal electrode fingers, which do not contribute to excitation of a surface acoustic wave, are formed at the positions from which the electrode fingers are withdrawn.

7. A surface acoustic wave resonator according to one of claims 4 or 5, wherein reflectors are closely arranged on both sides of the interdigital transducer in a direction in parallel to a propagation direction of a surface acoustic wave to be excited.

8. A surface acoustic wave filter comprising a piezoelectric substrate, a plurality of surface acoustic wave resonators which are formed on the piezoelectric substrate and electrically connected to each other in a ladder form, wherein at least one of the surface acoustic wave resonators is a surface acoustic wave resonator according to any one of claims 4 or 5.

9. A surface acoustic wave resonator according to any one of claims 4 or 5, wherein the number of the withdrawal electrode fingers is from 2 to 22% of the total number of electrode fingers none of which are withdrawn.

10. A surface acoustic wave resonator according to any one of claims 4 or 5, wherein the number of electrode fingers N lying between the withdrawal electrode fingers are represented by the following expression:

$$1 \leq N \leq 0.4(Ra-Rm-4)$$

wherein Ra represents the total number of electrode fingers none of which are withdrawn and Rm represents the number of the withdrawal electrode fingers.

* * * * *